(12) United States Patent
Iwashita

(10) Patent No.: US 7,464,015 B2
(45) Date of Patent: Dec. 9, 2008

(54) METHOD AND APPARATUS FOR SUPPORTING VERIFICATION, AND COMPUTER PRODUCT

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 650 days.

(21) Appl. No.: 11/116,283

(22) Filed: Apr. 28, 2005

(65) Prior Publication Data
US 2006/0155521 A1 Jul. 13, 2006

(30) Foreign Application Priority Data
Jan. 7, 2005 (JP) ............... 2005-003097

(51) Int. Cl.
*G06F 17/50* (2006.01)
(52) U.S. Cl. ................. 703/15; 703/2; 716/5
(58) Field of Classification Search ......... 703/2, 703/13, 14, 15; 716/5
See application file for complete search history.

(56) References Cited

U.S. PATENT DOCUMENTS

| | | | |
|---|---|---|---|
| 6,975,976 B1 * | 12/2005 | Casavant et al. ......... | 703/14 |
| 7,093,216 B2 * | 8/2006 | Nozuyama ............... | 716/4 |
| 7,292,970 B1 * | 11/2007 | Hurlock ................... | 703/23 |
| 2002/0038203 A1 * | 3/2002 | Tsuchiya ................. | 703/15 |
| 2004/0230928 A1 * | 11/2004 | Nozuyama ............... | 716/5 |

FOREIGN PATENT DOCUMENTS

| | | |
|---|---|---|
| JP | 63-205760 | 8/1988 |
| JP | 3-62172 | 3/1991 |
| JP | 7-319927 | 12/1995 |
| JP | 2004-70457 | 3/2004 |

OTHER PUBLICATIONS

Devadas et al., S. An Observability-Based Code Coverage Metric for Functional Simulation, IEEE/ACM Int. Computer-Aided Design, ICCAD-96, Nov. 1996, pp. 418-425.*
Hajjar et al., A. An Accurate Coverage Forecasting Model for Behavioral Model Verification, The First IEEE Int. Workshop on Electronic Design, Test and Applications, Jan. 2002, pp. 104-110.*

* cited by examiner

*Primary Examiner*—Russell Frejd
(74) *Attorney, Agent, or Firm*—Staas & Helsey LLP

(57) ABSTRACT

In a verification supporting apparatus, when an obtaining unit obtains a verification scenario, a substituting unit substitutes an undefined value for a variable value in the verification scenario. A first executing unit executes a logic simulation using an input pattern. From a result of the logic simulation, a determining unit generates code-coverage upper-limit information. A setting unit sets input patterns by giving an arbitrary logic value to the variable value. A second executing unit executes a logic simulation using the input patterns set. A generating unit generates code coverage from the input patterns set. A calculating unit calculates a level of achievement of the code coverage with respect to the code-coverage upper-limit information.

10 Claims, 22 Drawing Sheets

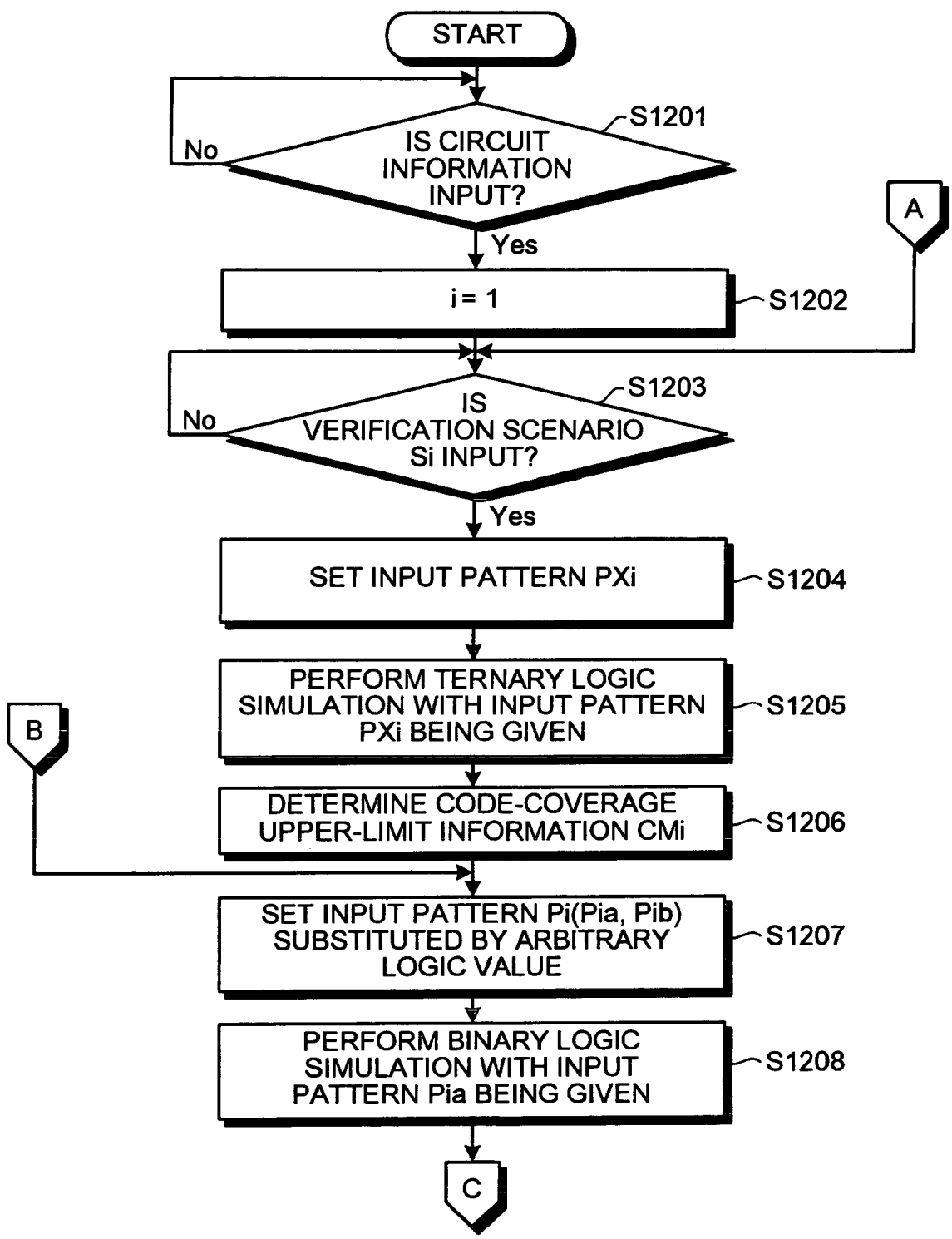

FIG. 13

```
001  module Ex2(clk, op, data, acc);
002    input clk;
003    input [1:0] op;
004    input [7:0] data;
005    output [7:0] acc;
006
007    reg [7:0] acc;
008    reg zero;
009
010    always @(posedge clk) begin
011      case (op)
012        2'b00:
013          acc <= data;
014        2'b01:
015          acc <= acc + data;
016        2'b10:
017          if (data == 8'b00000000) begin
018            zero <= 1'b1;
019          end
020          else begin
021            zero <= 1'b0;
022          end
023        2'b11:
024          if (zero) begin
025            acc <= acc + data;
026          end
027      endcase
028    end
029  endmodule
```

FIG. 16

```
001   module Ex2(clk, op, data, acc);
002     input clk;
003     input [1:0] op;
004     input [7:0] data;
005     output [7:0] acc;
006
007     reg [7:0] acc;
008     reg zero;
009
010     always @(posedge clk) begin
011       case (op)
012         2'b00:
013           acc <= data;
014         2'b01:
015           acc <= acc + data;
016         2'b10:
              if (data == 8'b00000000) begin
017             zero <= 1'b1;
018           end
019           else if (!(data == 8'b00000000)) begin
020             zero <= 1'b0;
021           end
022           else begin
                zero <= 1'bx;        // {018, 021}
              end
023         2'b11:
024           if (zero) begin
025             acc <= acc + data;
026           end
              else if (!zero) begin
              end
              else begin
                acc <= 8'bxxxxxxxx;  // {025}
              end
            default:
              begin
                zero <= 1'bx;        // {018, 021}
                acc <= 8'bxxxxxxxx;  // {013, 015, 025}
              end
027       endcase
028     end
029   endmodule
```

2200

2200

METHOD AND APPARATUS FOR SUPPORTING VERIFICATION, AND COMPUTER PRODUCT

CROSS-REFERENCE TO RELATED APPLICATIONS

This application is based upon and claims the benefit of priority from the prior Japanese Patent Application No. 2005-003097, filed on Jan. 7, 2005, the entire contents of which are incorporated herein by reference.

BACKGROUND OF THE INVENTION

1) Field of the Invention

The present invention relates to a technology for supporting verification in which a logic design of hardware is verified using a logic simulation.

2) Description of the Related Art

Conventionally, two major types of verification coverage are used as an index of sufficiency of logic simulation patterns. One of the two types of verification coverage is functional coverage, which is to check whether all functions of a verification target are covered based on external specifications of the verification target.

The other one is code coverage, which is based on a source code of a verification target. The code coverage includes, for example, line coverage, toggle coverage, and finite-state-machine (FSM) coverage. The line coverage is aimed at executing all lines in the source code. The toggle coverage is aimed at changing all signal lines described in the source code. The FSM coverage aimed at covering all states and state transitions by determining a FSM from the source code.

The functional coverage and the code coverage have conventionally been used. An example of a conventional technology using the functional coverage is a coverage calculating method disclosed in Japanese Patent Laid-Open Publication No. 2004-70457. In this coverage calculating method, a property and test patterns actually executed are input, and based on the property, a coverage rate of effective test patterns corresponding to the property is calculated.

An example of a method of measuring the functional coverage is a calculating method disclosed in Japanese Patent Laid-Open Publication No. H3-062172. In this method, the functional coverage is set to 100 percent (%) in a logic simulation, thereby verifying whether all functions required as seen from outside are accurately implemented.

An example of a conventional technology using the code coverage is a coverage scheme disclosed in Japanese Patent Laid-Open Publication No. S63-205760. In this coverage scheme, information regarding signal variations in a logic simulation is recorded so as to operate all signals.

However, in the functional coverage described above, even a case in which no distinction can be seen from the outside may be fragmented into sub-cases for processing in actual implementation in an internal hardware. All of these sub-cases should be covered, but the functional coverage only covers one of these sub-cases. Therefore, verification is disadvantageously insufficient.

For example, a logic circuit is assumed to have external specifications as follows:

(1) The circuit includes five input terminals A, B, C, D, and E and one output terminal F;

(2) The circuit has a first function such that, when a value of A is 0, a logical function f1 is applied to two input values of B and C to obtain a result f1 (B, C) for output to F; and (3) The circuit has a second function such that, when the value of A is 1, a logical function f2 is applied to two input values of D and E to obtain a result f2 (D, E) for output to F.

From these external specifications, as the functional coverage, a requirement of "a pattern of executing the first function and a pattern of executing the second function are executed more than once for each the patterns" is considered. For this requirement, 100% coverage is achieved with simulations that are performed regarding only two patterns, executing the first function (A, B, C, D, E)=(0, 0, 0, 0, 0) and executing the second function (A, B, C, D, E)=(1, 0, 0, 0, 0).

This is a minimum coverage requirement to be achieved, but is hardly sufficient. For example, requirement that is further subdivided may include "the pattern of executing the first function is executed on all combinations of the values of B and C, and the pattern of executing the second function is executed on all combinations of the values of D and E". However, in an actual large-scale logic circuit (having internal states and including many input terminals), such a way of executing the patterns on all combinations is unrealistic. Therefore, the coverage requirement should be moderate.

On the other hand, if the code coverage is set to 100%, execution of the source code can be roughly checked. However, to make verification meaningful, execution at a stage where the execution may influence the final result is required instead of merely executing. In view of the above, such a requirement has not been included in the conventional code coverage.

FIG. 22 is a circuit diagram of the logic circuit described above. For example, the toggle coverage, which is one type of the code coverage, is applied to a logic circuit 2200 shown in FIG. 22. In toggle coverage, calculation is performed based on whether a value variation occurs in each of signal lines in the circuit during simulation. In this example, because 10 signal lines A to J are present, a modulus of the coverage is 10.

When simulation is carried out with two patterns (0, 0, 0, 0, 0) and (1, 0, 0, 0, 0) causing 100% functional coverage, simulation results shown in FIGS. 23 and 24 are obtained. FIGS. 23 and 24 are schematics for explaining the simulation results of the logic circuit 2200. In the simulation results shown in FIGS. 23 and 24, three signal lines A, H, and F have variations in value. Therefore, only 30% of the toggle coverage is achieved. Then, a pattern (1, 1, 1, 1, 1) is added for the simulation, a simulation result shown in FIG. 25 is obtained. FIG. 25 is a schematic for explaining the simulation result of the logic circuit 2200. As shown in FIG. 25, rests of the signal lines also have variations in value, and 100% toggle coverage is achieved.

However, the logic circuit 2200 has a structure in which, where A=1, the values of B, C, and G do not influence on an output F. Therefore, value variations of B, C, and G covered by the pattern (1, 1, 1, 1, 1) finally added does not serve a purpose of verification. As such, by merely attempting to achieve the functional coverage or the code coverage individually, omission in verification as described above cannot be prevented.

On the other hand, when all combinations of the functional coverage and the code coverage are simply tried to be covered, there might be a combination theoretically unachievable among the combinations. Therefore, it is impossible to determine to what extent the combinations should be covered to be sufficient for verification. Therefore, the combinations of the functional coverage and the code coverage are also impractical.

For example, in the example described above, the modulus of the functional coverage is 2, and the modulus of the toggle coverage is 10. Therefore, 20 combinations are considered.

However, in practice, A is always 0 when the first function is executed, and therefore, a combination of execution for the first function and a value variation in the signal A is not achievable. Moreover, the value of the signal line I is fixed to 0 due to A=0. Therefore, a combination of execution of the first function and a value variation in the signal line I is not achievable either. Similarly, neither a combination of the first function and a value variation in the signal line J nor a combination of the second function and value variations in the signal lines A and H are achievable. To an actual large-scale circuit, performing verification individually on each combination is difficult and impractical.

SUMMARY OF THE INVENTION

It is an object of the present invention to at least solve the problems in the conventional technology.

A computer-readable recording medium according to one aspect of the present invention stores therein a computer program for supporting verification making a computer execute obtaining circuit information and a verification scenario, the circuit information of a verification target circuit, the verification scenario including a variable value for verifying the verification target circuit; executing a logic simulation by giving the verification scenario to the circuit information; and determining, based on a result of the logic simulation, code-coverage upper-limit information that indicates a portion to which the variable value is propagated in the circuit information.

An apparatus for supporting verification according to another aspect of the present invention includes an obtaining unit that obtains circuit information and a verification scenario, the circuit information of a verification target circuit, the verification scenario including a variable value for verifying the verification target circuit; an executing unit that executes a logic simulation by giving the verification scenario to the circuit information; and a determining unit that determines, based on a result of the logic simulation, code-coverage upper-limit information that indicates a portion to which the variable value is propagated in the circuit information.

A method for supporting verification according to still another aspect of the present invention includes obtaining circuit information and a verification scenario, the circuit information of a verification target circuit, the verification scenario including a variable value for verifying the verification target circuit; executing a logic simulation by giving the verification scenario to the circuit information; and determining, based on a result of the logic simulation, code-coverage upper-limit information that indicates a portion to which the variable value is propagated in the circuit information.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 12A and 12B are a flowchart of a verification supporting process according to the first embodiment;

FIG. 13 is a schematic of circuit information according to a second embodiment of the present invention;

FIG. 16 is a schematic of an RTL description that is rewritten;

DETAILED DESCRIPTION

Exemplary embodiments of the present invention are described in detail below with reference to the accompanying drawings.

Figure 1:
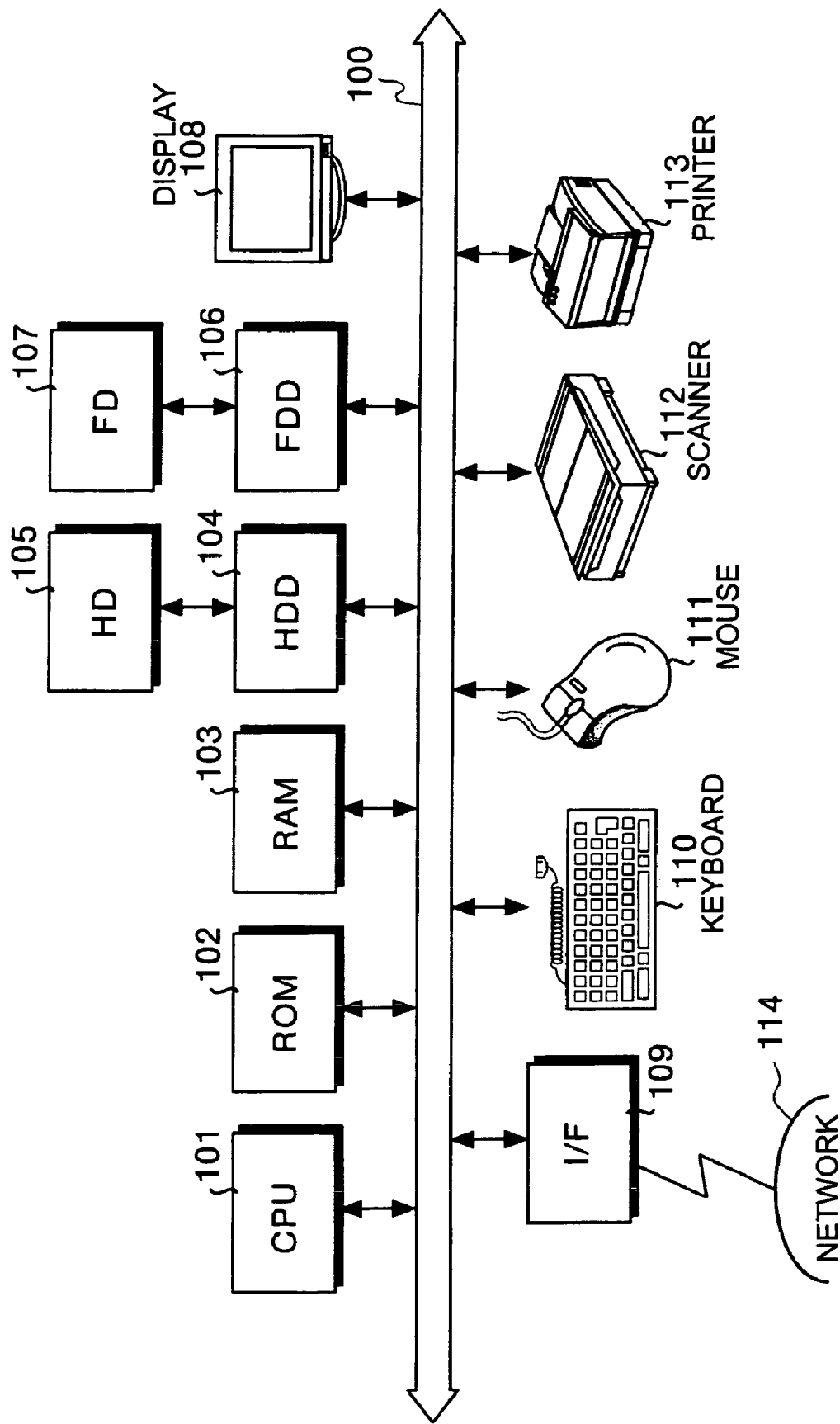
FIG. 1 is a schematic of a configuration of a verification supporting apparatus according to an embodiment of the present invention.

FIG. 1 is a schematic of a configuration of a verification supporting apparatus according to an embodiment of the present invention.

As shown in FIG. 1, the verification supporting apparatus includes a central processing unit (CPU) 101, a ROM 102, a RAM 103, a hard disk drive (HDD) 104, a hard disk (HD) 105, a flexible disk drive (FDD) 106, a flexible disk (FD) 107, which is an example of a removable recording medium, a display 108, an interface (I/F) 109, a keyboard 110, a mouse 111, a scanner 112, and a printer 113. These components are connected through a bus 100.

The CPU 101 controls a whole of the apparatus. The ROM 102 stores a computer program such as a boot program. The RAM 103 is used as a work area of the CPU 101. The HDD 104 controls read/write of data from/to the HD 105 in accordance with the control of the CPU 101. The HD 105 stores data that is written in accordance with the control of the HDD 104.

The FDD 106 controls data reading from and writing in the FD 107 under the control of the CPU 101. The FD 107 stores the data written under the control of the FDD 106 and allows the verification supporting apparatus to read the data stored in the FD 107.

Apart from the FD 107, a compact disc-read only memory (CD-ROM), a compact disc-readable (CD-R), a compact disc-rewritable (CD-RW), a magnetic optical disc (MO), a digital versatile disc (DVD), and a memory card may also be used as the removable recording medium. The display 108 displays a curser, an icon, a tool box as well as data such as documents, images, and functional information. A cathode ray tube (CRT), a thin film transistor (TFT) liquid crystal display, or a plasma display can be used as the display 108.

The I/F 109 is connected to a network 114 such as the Internet through a communication line and is connected to other devices through the network 114. The I/F 109 controls the network 114 and an internal interface to control input/output of data to/from external devices. A modem or a local area network (LAN) adapter can be used as the I/F 109.

The keyboard 110 includes keys for inputting characters, numbers, and various instructions, and is used to input data. A touch panel input pad or a numerical key pad may also be used as the keyboard 110. The mouse 111 is used to shift the curser, select a range, shift windows, and change sizes of the windows on a display. A track ball or a joy stick may be used as a pointing device if functions similar to those of the mouse 111 are provided.

The scanner 112 optically captures an image and inputs image data to the apparatus. The scanner 112 may be provided with an optical character read (OCR) function. The printer 113 prints the image data and document data. For example, a laser printer or an inkjet printer may be used as the printer 113.

Figure 2:
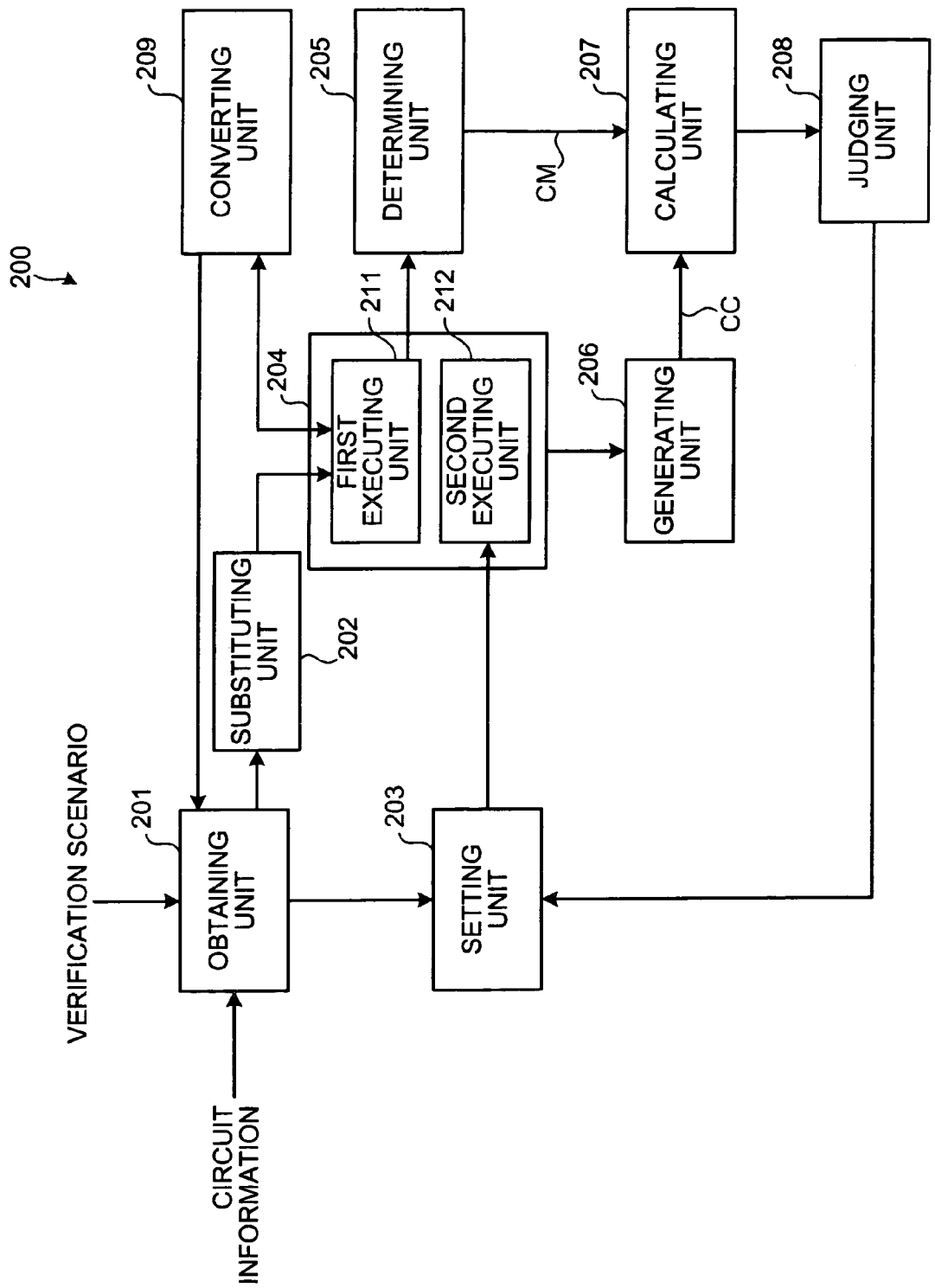
FIG. 2 is a block diagram of the verification supporting apparatus according to the embodiment.

FIG. 2 is a block diagram of the verification supporting apparatus according to the embodiment. As shown in FIG. 2, a verification supporting apparatus 200 includes an obtaining unit 201, a substituting unit 202, a setting unit 203, an executing unit 204, a determining unit 205, a generating unit 206, a calculating unit 207, a judging unit 208, and a converting unit 209.

The obtaining unit 201 obtains circuit information of a verification target circuit and a verification scenario S including a variable value for verifying a function of the verification target circuit. The verification target circuit is a logic circuit, such as a large-scale integrated circuit (LSI), to be verified. The circuit information is information regarding the verification target circuit, and is, for example, a net list or a register-transfer-level (RTL) description.

Figure 3:
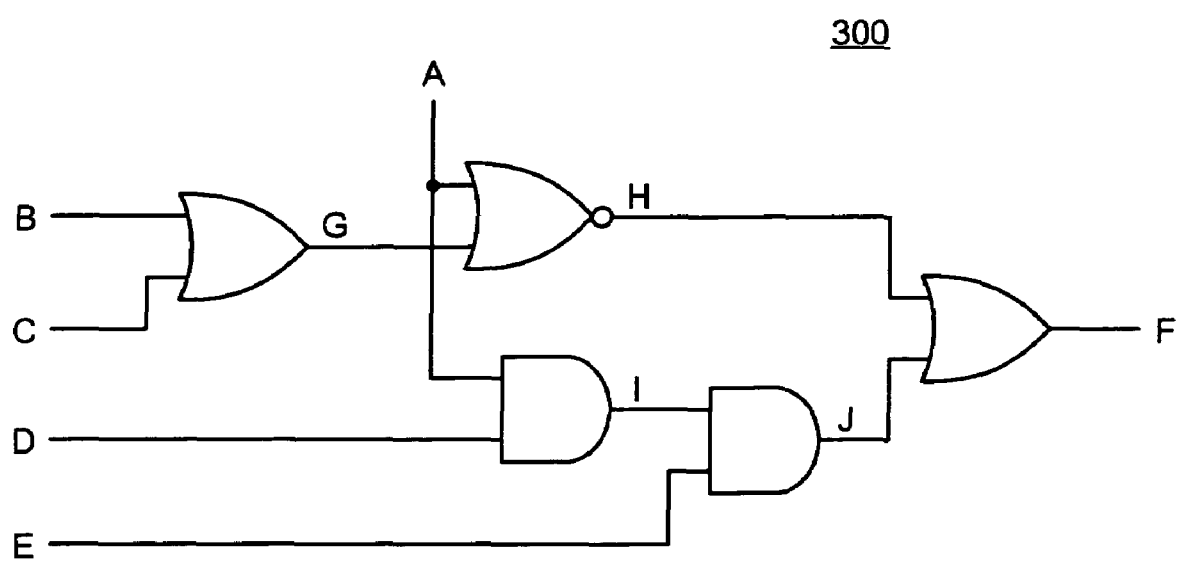
FIG. 3 is a schematic of circuit information of a verification target circuit.

FIG. 3 is a schematic for explaining the circuit information of the verification target circuit. In FIG. 3, circuit information 300 is represented based on a net list, and includes inputs A to E, an output F, and internal signal lines G to J. Hereinafter, these A to J may be simply referred to as "signal lines A to J".

The verification scenario S is a set of input simulation patterns (hereinafter, "input pattern") for the purpose of verifying an arbitrary function of the verification target circuit. Specifically, an input pattern is a set of values (parameters) given to the circuit information 300 for executing a logic simulation, and includes a variable value. The variable value is a value that can take either one of logic values of "0" and "1".

For example, in the circuit information 300 shown in FIG. 3, the verification scenario S is as follows. The verification scenario S is a scenario for verifying a function of the verification target circuit when the input A is 0. Each of values b, c, d, and e is an arbitrary variable value.

The Verification Scenario S:

"The following input pattern PV is input to the verification target circuit and then the output F is observed, thereby verifying the function of the verification target circuit.

PV=(A, B, C, D, E)=(0, b, c, d, e)"

The obtaining unit 201 can obtain the circuit information 300 and the verification scenario S through operation of the keyboard 110 or the mouse 111 shown in FIG. 1, through reception via the network 114 from an external server, or through extraction from a database. The function of this obtaining unit 201 is realized by, for example, the CPU 101 executing a program recorded on a recording medium, such as the ROM 102, the RAM 103, the HD 105, and the FD 107 shown in FIG. 1, or by the I/F 109.

The substituting unit 202 shown in FIG. 2 substitutes an undefined value or a symbol for the variable value of the verification scenario S. Specifically, the substituting unit 202, by the substitution of the undefined value or the symbol, changes the input pattern in the verification scenario S to an input pattern including the undefined value or the symbol.

For example, for the input pattern (A, B, C, D, E)=(0, b, c, d, e) of the verification scenario S, the substituting unit 202 substitutes undefined values x for the variable values (b, c, d, e), thereby obtaining an input pattern PX.

PX=(A, B, C, D, E)=(0, x, x, x, x)

Furthermore, for an input pattern PV, the setting unit 203 substitutes symbols (p, q, r, s) for the variable values (b, c, d, e), thereby obtaining an input pattern PS.

PS=(A, B, C, D, E)=(0, p, q, r, s)

A function of this substituting unit 202 is realized specifically by, for example, the CPU 101 executing a program recorded on a recording medium, such as the ROM 102, the RAM 103, the HD 105, and the FD 107 shown in FIG. 1.

The setting unit 203 gives sets the input pattern by giving an arbitrary logic value to the variable value of the verification scenario S. Specifically, the setting unit 203 prepares, from a set of input patterns represented in the verification scenario S, specific input patterns representing patterns before and after signal variations. For example, for the input pattern PV, the setting unit 203 substitutes for the variable values (b, c, d, e), an arbitrary logic value "0" (b=0, c=0, d=0, e=0), thereby obtaining an input pattern P1.

P1=(A, B, C, D, E)=(0, 0, 0, 0, 0)

Moreover, for the input pattern PV, each of the variable values (b, c, d, e) are substituted by an arbitrary logic value "1" (b=1, c=1, d=1, e=1), thereby obtaining an input pattern P2.

P2=(A, B, C, D, E)=(0, 1, 1, 1, 1)

The input pattern P1 represents an input pattern before signal variations, the pattern being inputted to the verification target circuit, while the input pattern P2 represents an input pattern after signal variations. The input pattern P2 is changed from the input pattern P1.

A function of the setting unit 203 is achieved specifically by, for example, the CPU 101 executing a program recorded on a recording medium, such as the ROM 102, the RAM 103, the HD 105, and the FD 107 shown in FIG. 1.

The executing unit 204 executes a logic simulation with an input pattern being given to the circuit information 300. The executing unit 204 includes a first executing unit 211 and a second executing unit 212. The first executing unit 211 gives the verification scenario S, specifically, the input pattern PX (or PS), to the circuit information 300, thereby executing a logic simulation in the verification target circuit.

The second executing unit 212 gives the input patterns P1 and P2 set by the setting unit 203 to the circuit information 300, thereby executing a logic simulation in the verification target circuit. The function of this executing unit 204 is achieved specifically by, for example, the CPU 101 executing a program recorded on a recording medium, such as the ROM 102, the RAM 103, the HD 105, and the FD 107 shown in FIG. 1.

The determining unit 205 determines code-coverage upper-limit information based on an execution result obtained through the execution of the logic simulation. The code-coverage upper-limit information represents code coverage that is represented by a portion to which an arbitrary value has been propagated in the circuit information 300 and that is assumed to be achievable when all input patterns included in the verification scenario S are executed. Specifically, the determining unit 205 can determine the code-coverage upper-limit information from the execution result. This code-coverage upper-limit information can be used for evaluating verification coverage of the verification target circuit.

For example, an execution result of a logic simulation in which the input pattern PX including the undefined value x is given to the circuit information 300 is represented by a set of values (0, 1, x), which are propagated to the signal lines in the circuit information 300. Thus, from the execution result, a set of signal lines of which a value propagated is the undefined value x is extracted.

More specifically, since the input pattern PX is (A, B, C, D, E)=(0, x, x, x, x) in the circuit information 300 of the verification target circuit shown in FIG. 3, the undefined value x has been propagated to the inputs B, C, D, and E. Also, when it is assumed that the undefined value x has been propagated to the output F and the internal signal lines G and H and not to the internal signal lines I and J, the determining unit 205 determines a code-coverage upper-limit information CM as follows.

CM=(B, C, D, E, F, G, H)

The code-coverage upper-limit information CM may be determined by counting the number of signal lines to which the undefined value x has been propagated. In the example described above, the signal lines to which the undefined value x has been propagated are six signal lines of B, C, D, E, F, and G. Therefore, the code-coverage upper-limit information CM is determined as CM=6. The function of this determining unit 205 is achieved specifically by, for example, the CPU 101 executing a program recorded on a recording medium, such as the ROM 102, the RAM 103, the HD 105, and the FD 107 shown in FIG. 1.

The generating unit 206 generates code coverage CC regarding the circuit information 300 based on the execution result obtained by the second executing unit 212. The code coverage CC is coverage based on a source code of the verification target circuit. Examples of the code coverage CC include line coverage aimed at executing all lines in source code, toggle coverage aimed at changing all signal lines described in source code, and FSM coverage aimed at covering all states and state transitions by determining an FSM from source code.

The code coverage CC is calculated by comparing an execution result R1 of a logic simulation executed by the second executing unit 212 given with the input pattern P1 and an execution result R2 of a logic simulation executed by the second executing unit 212 given with the input pattern P2. Specifically, the value of each of the signal lines A to J in the execution result R1 and the value of each of the signal lines A to J in the execution result R2 are compared with each other, and then a set of signal lines with their values being changed is taken as the code coverage CC.

For example, it is assumed that the execution result R1 when the input pattern P1 is given to the circuit information 300 is represented by a set of values of the signal lines as follows.

R1=(A, B, C, D, E, F, G, H, I, J)=(0, 0, 0, 0, 0, 1, 0, 1, 0, 0)

Similarly, it is assumed that the execution result R2 when the input pattern P2 is given to the circuit information 300 is represented by a set of values of the signal lines as follows.

R2=(A, B, C, D, E, F, G, H, I, J)=(0, 1, 1, 1, 1, 0, 1, 0, 0, 0)

When these results R1 and R2 are compared with each other, the signal lines with their values being changed are B, C, D, E, F, G, and H. Therefore, the code coverage CC in this case is as follows.

CC=(B, C, D, E, F, G, H)

A function of this generating unit 206 is achieved specifically by, for example, the CPU 101 executing a program recorded on a recording medium, such as the ROM 102, the RAM 103, the HD 105, and the FD 107 shown in FIG. 1.

The calculating unit 207 calculates a level of achievement of the code coverage CC with respect to the code-coverage upper-limit information CM. For example, in the code coverage CC described above, the number of values in the code-coverage upper-limit information CM is "6", and the number of values in the code coverage CC that correspond to signal variations of the code-coverage upper-limit information CM is also "6". Therefore, the level of achievement is calculated as 6/6, that is, 100%.

When the code-coverage upper-limit information CM is determined by the number of signal lines of which values are changed, the calculating unit 207 calculates the level of achievement and the code coverage CC also by using the number of signal lines of which values are changed. In the example described above, the code-coverage upper-limit information CM represents 6 and the number of signal lines in the code coverage CC is also 6. Therefore, the level of achievement is calculated as 6/6, that is, 100%. A function of this calculating unit 207 is achieved specifically by, for example, the CPU 101 executing a program recorded on a recording medium, such as the ROM 102, the RAM 103, the HD 105, and the FD 107 shown in FIG. 1.

The judging unit 208 judges, based on the level of achievement, verification coverage achieved by the code coverage CC. Specifically, a threshold (for example, 100%) is set as reference to be compared with the level of achievement. Thus, it is judged whether the code coverage CC covers all execution results that are obtained when every input pattern in the verification scenario S is given.

When it is judged that the code coverage CC covers all execution results, the verification target circuit can be evaluated that the verification target circuit includes no design failure. On the other hand, when it is judged that the code coverage CC does not cover all execution results, the setting unit 203 gives a logic value different from the arbitrary value to the variable value in the verification scenario S, thereby setting another input pattern different from the input patterns P1 and P2.

The second executing unit 212 then executes a logic simulation with the other input pattern being given to the circuit information 300. Based on the execution results obtained by the second executing unit 212, the generating unit 206 generates another code coverage different from the code coverage CC. The other code coverage includes the code coverage CC, and further includes a value representing a new signal change by the other input pattern. The calculating unit 207 then calculates a level of achievement of the other code coverage with respect to the code-coverage upper-limit information CM, thereby achieving an increase in the level of achievement of the code coverage CC previously calculated.

Therefore, the input pattern to be given to the second executing unit 212 is automatically set until the level of achievement exceeds a threshold, thereby allowing the second executing unit 212 to automatically execute a logic simulation. Therefore, by referring to variations in the level of achievement, timing of ending the logic simulation is appropriately determined.

A function of this judging unit 208 is achieved specifically by, for example, the CPU 101 executing a program recorded on a recording medium, such as the ROM 102, the RAM 103, the HD 105, and the FD 107 shown in FIG. 1.

When the circuit information 300 is obtained as an RTL description, if the RTL includes a conditional branch statement in which conditions are not satisfied during a logic simulation by the first executing unit 211, the converting unit 209 converts, to an undefined value, the execution result of another conditional branch statement to which the conditional branch statement is branched. Specifically, when the execution result of the conditional branch statement included in the RTL description take an undefined value x, the execution result of another conditional branch statement to which the conditional branch statement is branched is converted to the undefined value x. Then, by using the converted RTL description, a logic simulation is executed by the first executing unit 211.

In other words, this process is a conversion process of, by recording such that all branch destination candidates have been executed, substituting the undefined value x for all variables that are influenced by the execution of the branch destinations. For example, in the following statement, if the value of A is x, (it is recorded such that the entire statement has been executed, and then) x is also substituted for B and C.

if($A==1$)$B<=1$;

else $C<=1$;

Here, more strictly, the operation may be such that x is substituted for B only if A is x and B is not 1, and x is substituted for C only if A is x and C is not 1. The execution of a logic simulation using of the converted RTL description makes it possible to accurately determine the code-coverage upper-limit information CM from the execution result, even if the circuit information 300 is represented by an RTL description.

When the circuit information 300 is represented by an RTL description and the RTL description includes a conditional branch statement, the converting unit 209 may convert the RTL description so that any branch destination can be executed. For example, if a logic simulator can only select an operation according to Verilog-Hardware Description Language (HDL) grammar rules, that is, an operation in which, in the example described above, the "if" condition is not satisfied and the "else" statement is executed, the RTL description is rewritten in advance so as to allow selection of a statement other than the "else" statement.

Similarly, with the execution of a third logic simulation using the converted RTL description, the converting unit 209 allows the code-coverage upper-limit information CM to be accurately determined from the execution result even if the circuit information 300 is represented by an RTL description.

Also, in the case where the input pattern given in the first executing unit 211 is the input pattern PS substituted by symbols, if a logic equation formed of a predetermined number of symbols appears during the logic simulation by the first executing unit 211, the converting unit 209 converts the logic equation to symbols that is less in number than the symbols in the logic equation appeared.

Specifically, during the logic simulation by the first executing unit 211, the symbols in the input pattern PS are propagated as becoming other symbols or logic equations by a logical operation of Boolean algebra when inputted to a logic circuit cell, such as an AND circuit, an OR circuit, an inverter, a NAND circuit, a NOR circuit, and an EOR circuit.

For example, when a three-input AND circuit is present in the circuit information 300, the execution result of a logic simulation with an input (0, p, q) is 0, while the execution result of a logic simulation with an input (1, p, q) is a logic equation of p·q. In this case, the number of symbols in the logic equation is 2. However, the number of symbols increases as the value propagates.

When the number of symbols forming the logic equation exceeds the predetermined number, by converting to another single symbol, the amount of calculation thereafter can be reduced. Thus, a logic simulation can be speeded up. A function of the converting unit 209 is achieved specifically by, for example, the CPU 101 executing a program recorded on a recording medium, such as the ROM 102, the RAM 103, the HD 105, and the FD 107 shown in FIG. 1.

Figure 4:
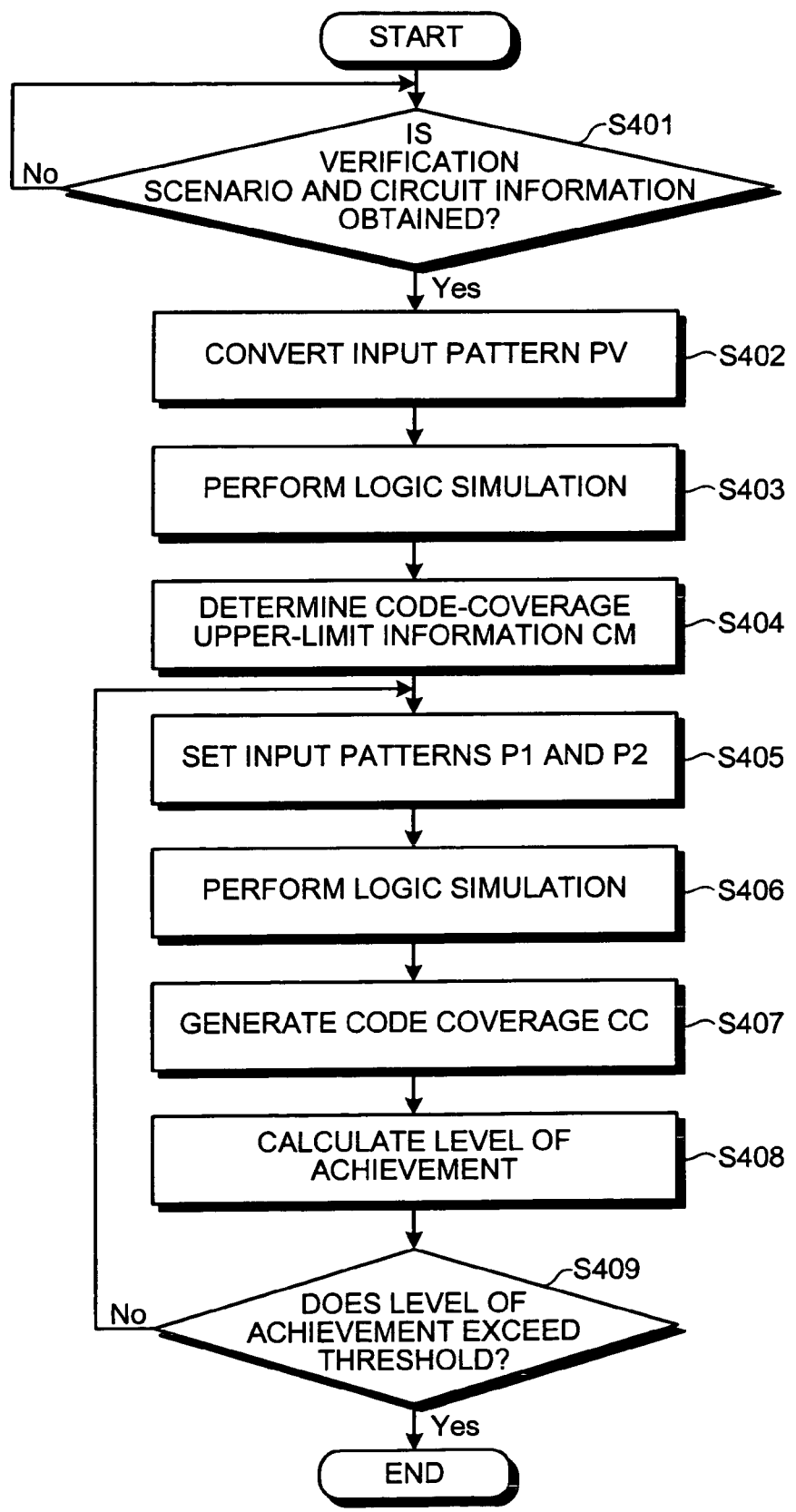
FIG. 4 is a flowchart of a verification supporting process of the verification supporting apparatus according to the embodiment.

FIG. 4 is a flowchart of a verification supporting process of the verification supporting apparatus 200 according to the embodiment of the present invention. As shown in FIG. 4, when the obtaining unit 201 obtains the verification scenario S and the circuit information 300 ("YES" at step S401), the variable value in the input pattern PV is substituted by the undefined value x or a symbol (step S402). Then, the first executing unit executes a logic simulation by giving the input pattern PX (or PS) obtained as a result of substitution to the circuit information 300 (step S403). Then, from the execution result, the determining unit 205 determines the code-coverage upper-limit information CM (step S404).

Then, the setting unit 203 sets the input patterns P1 and P2 by giving an arbitrary logic value to the variable value in the input pattern PF (step S405). The second executing unit 212 executes a logic simulation by giving the input patterns P1 and P2 to the circuit information 300 (step S406).

Then, the generating unit 206 generates the code coverage CC from the input patterns P1 and P2 (step S407). The calculating unit 207 calculates the level of achievement of the code coverage CC with respect to the code-coverage upper-limit information CM (step S408). Then, it is determined whether the level of achievement calculated exceeds a threshold (step S409).

If the level of achievement does not exceed the threshold ("NO" at step S409), the procedure returns to step S405 for resetting the input patterns. On the other hand, if the level of achievement exceeds the threshold ("YES" at step S409), a series of processes is finished. The conversion process by the converting unit 209 can be performed during the logic simulation at step S403.

According to the embodiment of the present invention, the user (or a designer or a verifier) can evaluate verification coverage using the level of achievement. When the level of achievement exceeds the threshold, the code coverage CC covers all input patterns that indicate the functions in the verification scenario S. Therefore, by applying the code coverage CC, omission of verification can be prevented, and timing of ending the logic simulation can be appropriately determined.

When the level of achievement does not exceed the threshold, this means that the code coverage CC does not cover all input patterns in the verification scenario S. Therefore, by referring to a signal line having a value that is different between the code-coverage upper-limit information CM and the code coverage CC, a design failure in the verification target circuit can be efficiently detected.

Furthermore, when the level of achievement does not exceed the threshold, an input pattern to be given to the second executing unit 212 is reset, and then a logic simulation is executed by the second executing unit 212. Then, a logic simulation is automatically performed until the level of achievement exceeds the threshold, thereby appropriately determining timing of ending the logic simulation.

In a first embodiment, the variable value included in the verification scenario is substituted for the undefined value x. Also, the toggle coverage is used as the code coverage CC.

Figure 5:
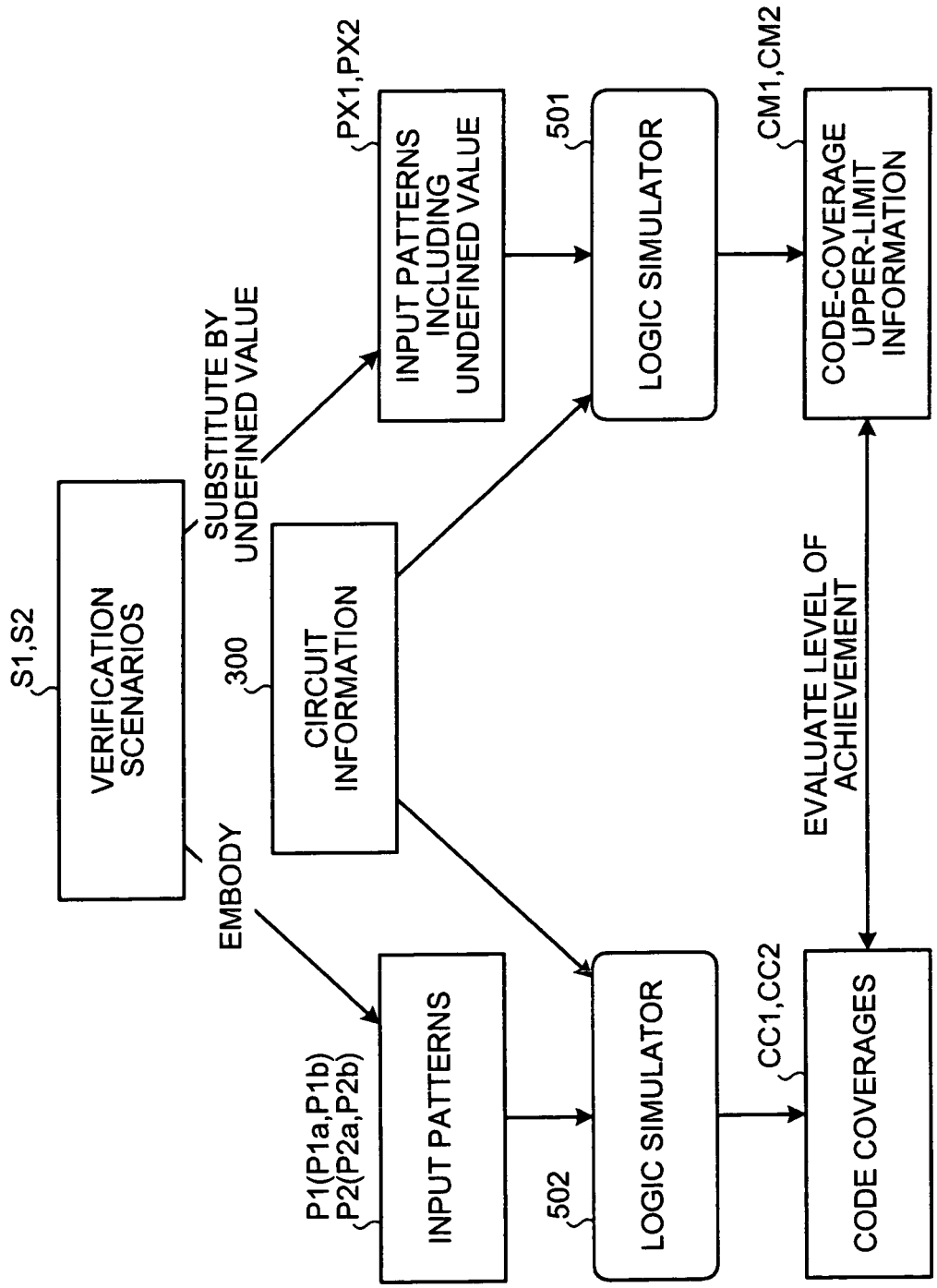
FIG. 5 is a schematic of a structure of a verification supporting apparatus according to a first embodiment the present invention.

FIG. 5 is a structure of a verification supporting apparatus according to the first embodiment. The verification scenario S is to verify a function of the verification target circuit. The verification scenario S shown in FIG. 5 includes verification scenarios S1 and S2.

Verification Scenario S1:

"An input pattern PV1 is input and then the output F is observed, thereby verifying a function F1.

PV1=(A, B, C, D, E)=(0, b, c, d, e)"

Verification Scenario S2:

"An input pattern PV2 is input and then the output F is observed, thereby verifying a function F2.

PV2=(A, B, C, D, E)=(1, b, c, d, e)"

Values (b, c, d, e) are variable values to which an arbitrary value of "0" or "1" can be assigned. For the verification scenario S1, the undefined value x is assigned to the variable values (b, c, d, e), thereby setting an input pattern PX1 including the undefined value x as follows.

PX1=(A, B, C, D, E)=(0, x, x, x, x)

Figure 6:
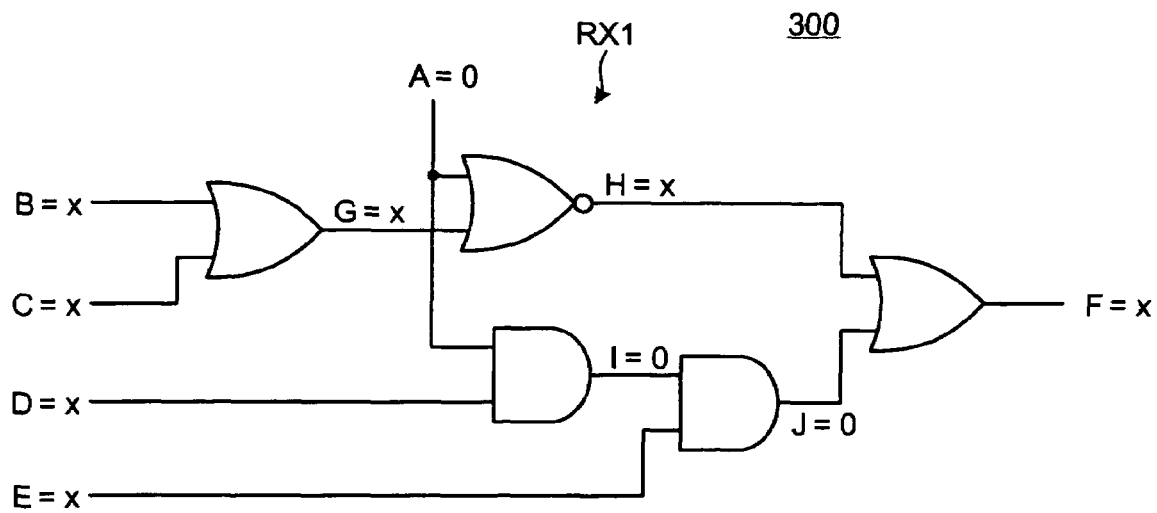
FIG. 6 is a schematic for explaining an execution result RX1 of a ternary logic simulation.

Then, by giving the input pattern PX1 to the circuit information 300, a logic simulation of three values (0, 1, x) is executed by a logic simulator 501. The logic simulator 501 corresponds to the first executing unit 211 described previously. An execution result RX1 of the logic simulation of the three values (0, 1, x) is shown in FIG. 6. FIG. 6 a schematic for explaining the execution result RX1 of the logic simulation of the three values (0, 1, x). The execution result RX1 shown in FIG. 6 is as follows.

RX1=(A, B, C, D, E, F, G, H, I, J)=(0, x, x, x, x, x, x, x, 0, 0)

From this execution result RX1, it is found that the undefined value x has been propagated to the signal lines B, C, D, E, F, G, and H. Therefore, code-coverage upper-limit information CM1 for the verification scenario S1 is as follows.

CM1=(B, C, D, E, F, G, H)

Therefore, for the verification scenario S1, it is estimated that signal value variations regarding these seven signal lines B, C, D, E, F, G, and H are achievable. Similarly, for the verification scenario S2, an input pattern PX2 can be set as follows.

PX2=(A, B, C, D, E)=(1, x, x, x, x)

Figure 7:
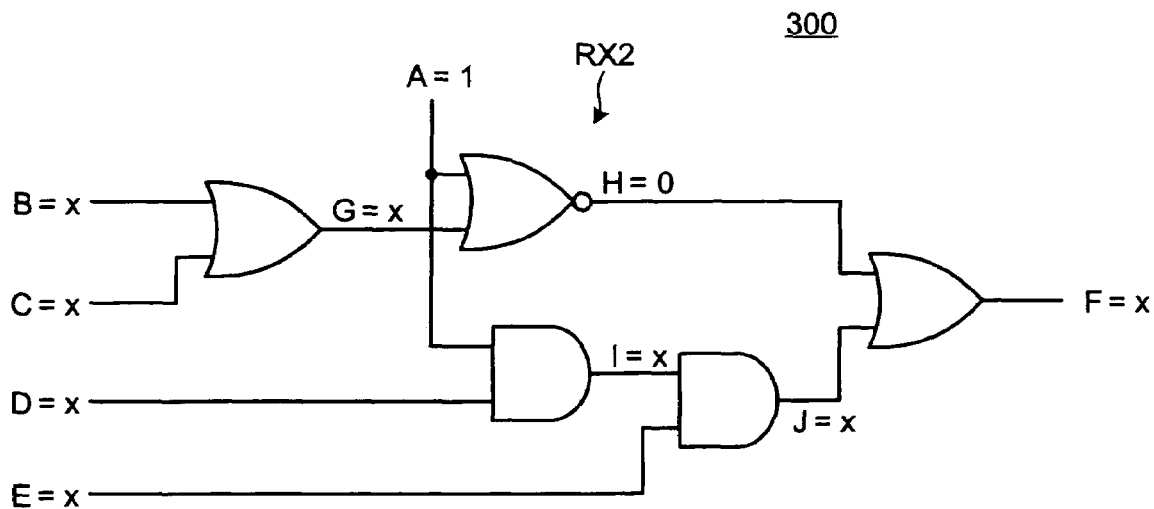
FIG. 7 is a schematic for explaining an execution result RX2 of the ternary logic simulation.

Then, by giving the input pattern PX2 being given to the circuit information 300, a logic simulation of the three values (0, 1, x) is executed by the logic simulator 501. An execution result RX2 of this logic simulation of the three values (0, 1, x) is shown in FIG. 7. FIG. 7 a schematic for explaining the execution result RX2 of the logic simulation of the three values (0, 1, x). The execution result RX2 shown in FIG. 7 is as follows.

RX2=(A, B, C, D, E, F, G, H, I, J)=(1, x, x, x, x, x, x, 0, x, x)

From the execution result RX2, it is found that the undefined value x has been propagated to the signal lines B, C, D, E, F, G, I, and J. Therefore, code-coverage upper-limit information CM2 is as follows.

CM2=(B, C, D, E, F, G, I, J)

Therefore, for the verification scenario S2, it is estimated that signal value variations regarding these eight signal lines B, C, D, E, F, G, I, and J are achievable.

In actual verification, the value of "0" or "1" is specifically assigned to the variable values (b, c, d, e) of the verification scenarios S1 and S2. Thus, input patterns that can cause signal value variations are set, a binary logic simulation is performed by a logic simulator 502, and then actual signal variations are observed. The logic simulator 502 corresponds to the second executing unit 212 described previously.

Then, based on how much pieces of code-coverage upper-limit information CM1 and CM2 have been achieved, verification coverage is evaluated. For example, the input pattern P1 (P1a, P1b) for the verification scenario S1 is specifically set as follows.

Input Pattern P1

P1a=(0, 0, 0, 0, 0)

P1b=(0, 1, 1, 1, 1)

Figure 8:
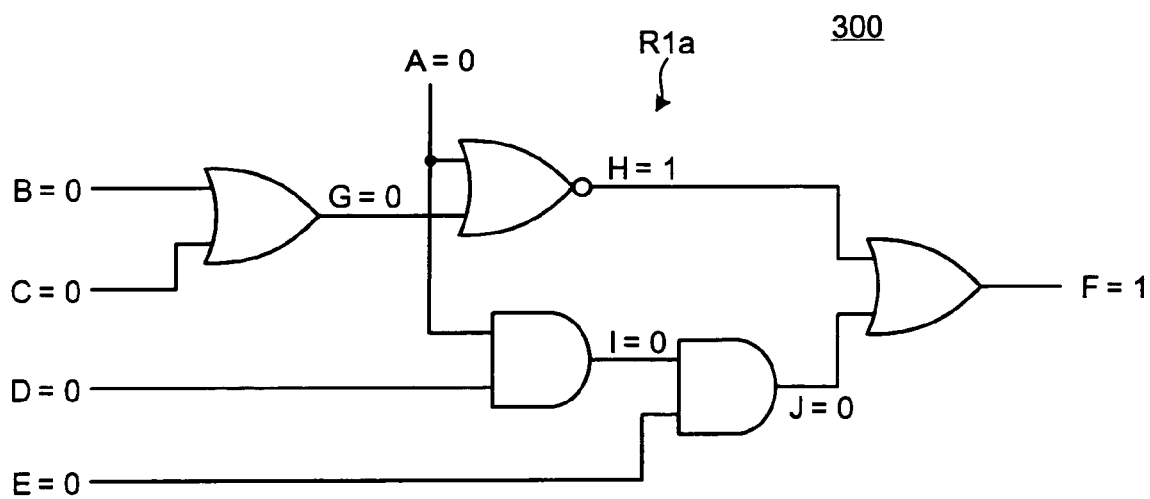
FIG. 8 is a schematic for explaining an execution result R1$a$ of a binary logic simulation.

An execution result R1a of a logic simulation of two values (0, 1) using the input pattern P1a is shown in FIG. 8. FIG. 8 is a schematic for explaining the execution result R1a of the logic simulation of the two values (0, 1). The execution result R1a shown in FIG. 8 is as follows.

R1a=(A, B, C, D, E, F, G, H, I, J)=(0, 0, 0, 0, 0, 1, 0, 1, 0, 0)

Figure 9:
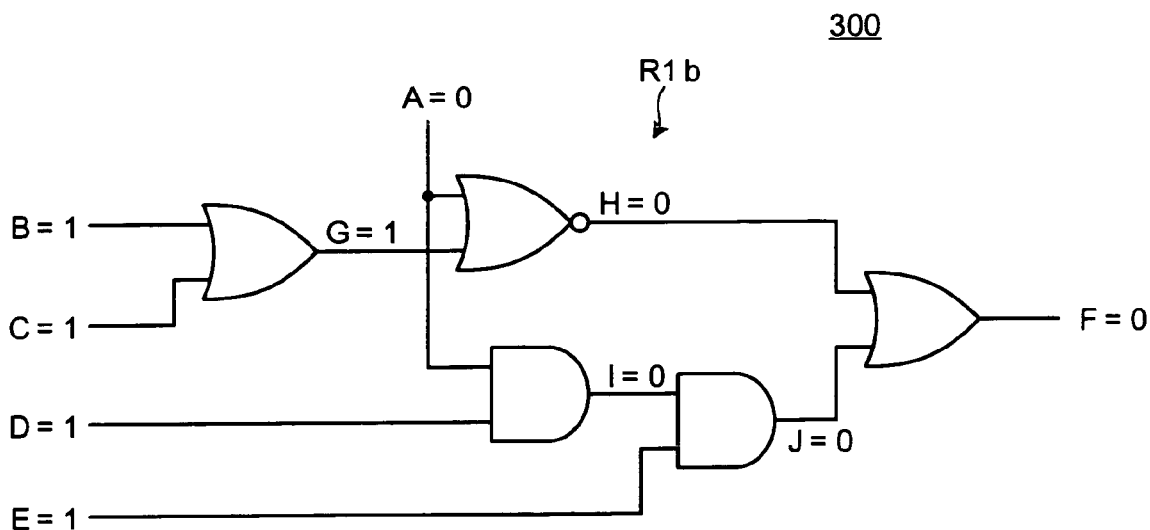
FIG. 9 is a schematic for explaining an execution result R1$b$ of the binary logic simulation.

An execution result R1b of a logic simulation of the two values (0, 1) using the input pattern P1b is shown in FIG. 9. FIG. 9 is a schematic for explaining the execution result R1b of the logic simulation of the two values (0, 1). The execution result R1bs shown in FIG. 9 is as follows.

R1b=(A, B, C, D, E, F, G, H, I, J)=(0, 1, 1, 1, 1, 0, 1, 0, 0, 0)

When the execution results R1a and R1b of the logic simulations shown in FIGS. 8 and 9 are compared, code coverage CC1 for the verification scenario S1 is as follows.

CC1=(B, C, D, E, F, G, H)

The signal lines (B, C, D, E, F, G, H) of the code coverage CC1 show variations in signal values from the execution result R1a to the execution result R1b. When the code coverage CC1 and the code-coverage upper-limit information CM1 are compared, the signal lines of the code coverage CC1 coincide with all signal lines of the code-coverage upper-limit information CM1. Therefore, the level of achievement is 100%. Thus, the requirements for the verification scenario S1 have been achieved.

The verification scenario S2 is processed in a similar manner. For example, the input pattern P2 (P2a, P2b) for the verification scenario S2 is specifically set as follows.

Input Pattern P2

P2a=(0, 0, 0, 0, 0)

P2b=(0, 1, 1, 1, 1)

Figure 10:
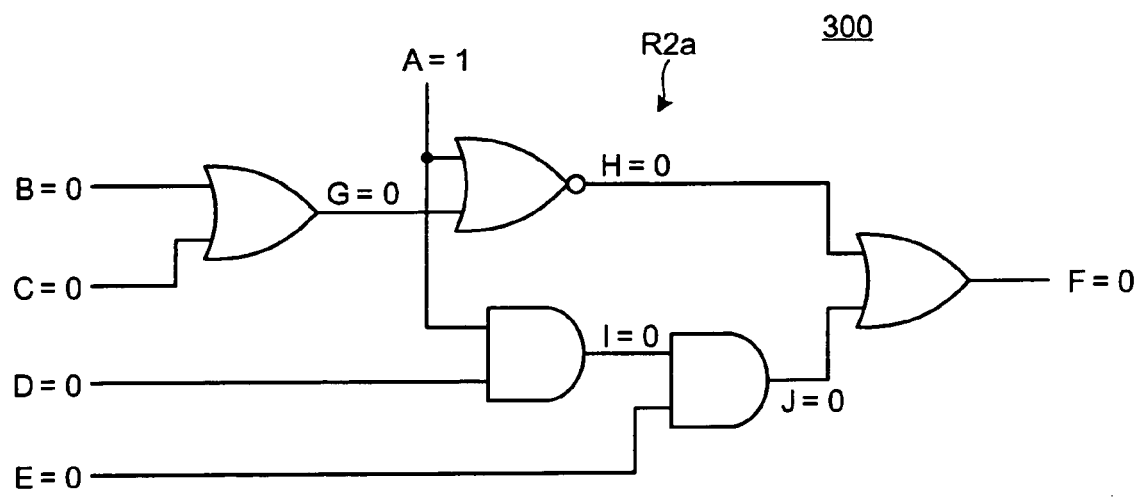
FIG. 10 is a schematic for explaining an execution result R2$a$ of the binary logic simulation.

An execution result R2a of a logic simulation of the two values (0, 1) using the input pattern P2a is shown in FIG. 10. FIG. 10 is a schematic for explaining the execution result R2a of the logic simulation of the two values (0, 1). The execution result R2a shown in FIG. 10 is as follows.

R2a=(A, B, C, D, E, F, G, H, I, J)=(1, 0, 0, 0, 0, 0, 0, 0, 0, 0)

Figure 11:
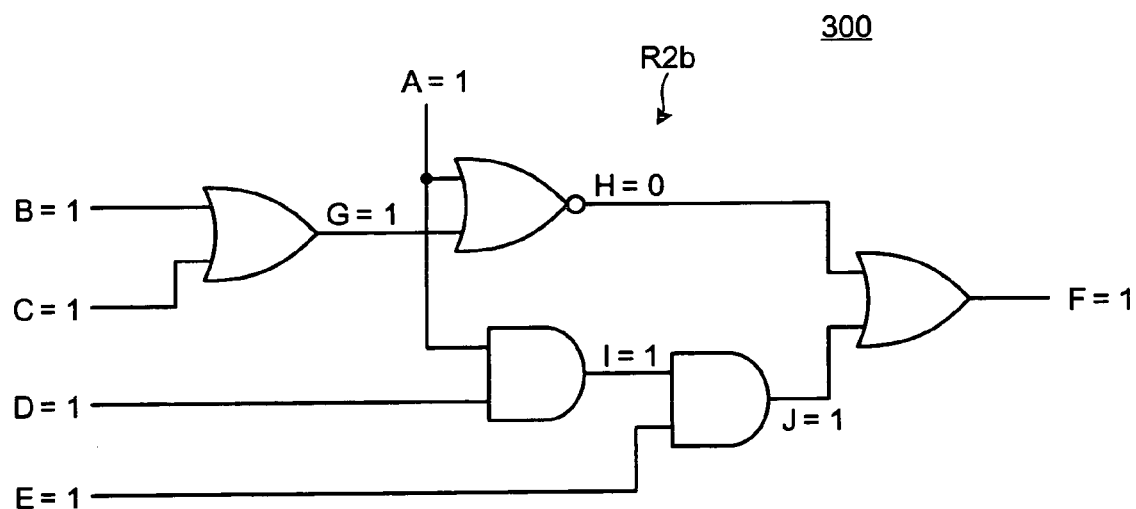
FIG. 11 is a schematic for explaining an execution result R2$b$ of the binary logic simulation.

An execution result R2b of a logic simulation of the two values (0, 1) using the input pattern P2b is shown in FIG. 11. FIG. 11 is a schematic for explaining the execution result R2b of the logic simulation of the two values (0, 1). The execution result R2b shown in FIG. 11 is as follows.

R2b=(A, B, C, D, E, F, G, H, I, J)=(1, 1, 1, 1, 1, 1, 1, 0, 1, 1)

When the execution results R2a and R2b of the logic simulations shown in FIGS. 10 and 11 are compared, code coverage CC2 for the verification scenario S2 is as follows.

CC2=(B, C, D, E, F, G, I, J)

The signal lines (B, C, D, E, F, G, I, J) of this code coverage CC2show represent variations in signal values from the execution result R2a to the execution result R2b. When the code coverage CC2 and the code-coverage upper-limit information CM2 are compared, the signal lines of the code coverage CC2 coincide with all signal lines of the code-coverage upper-limit information CM2. Therefore, the level of achievement is 100%. Thus, the code-coverage upper-limit information CM2 for the verification scenario S2 has been achieved.

Figure 12B:
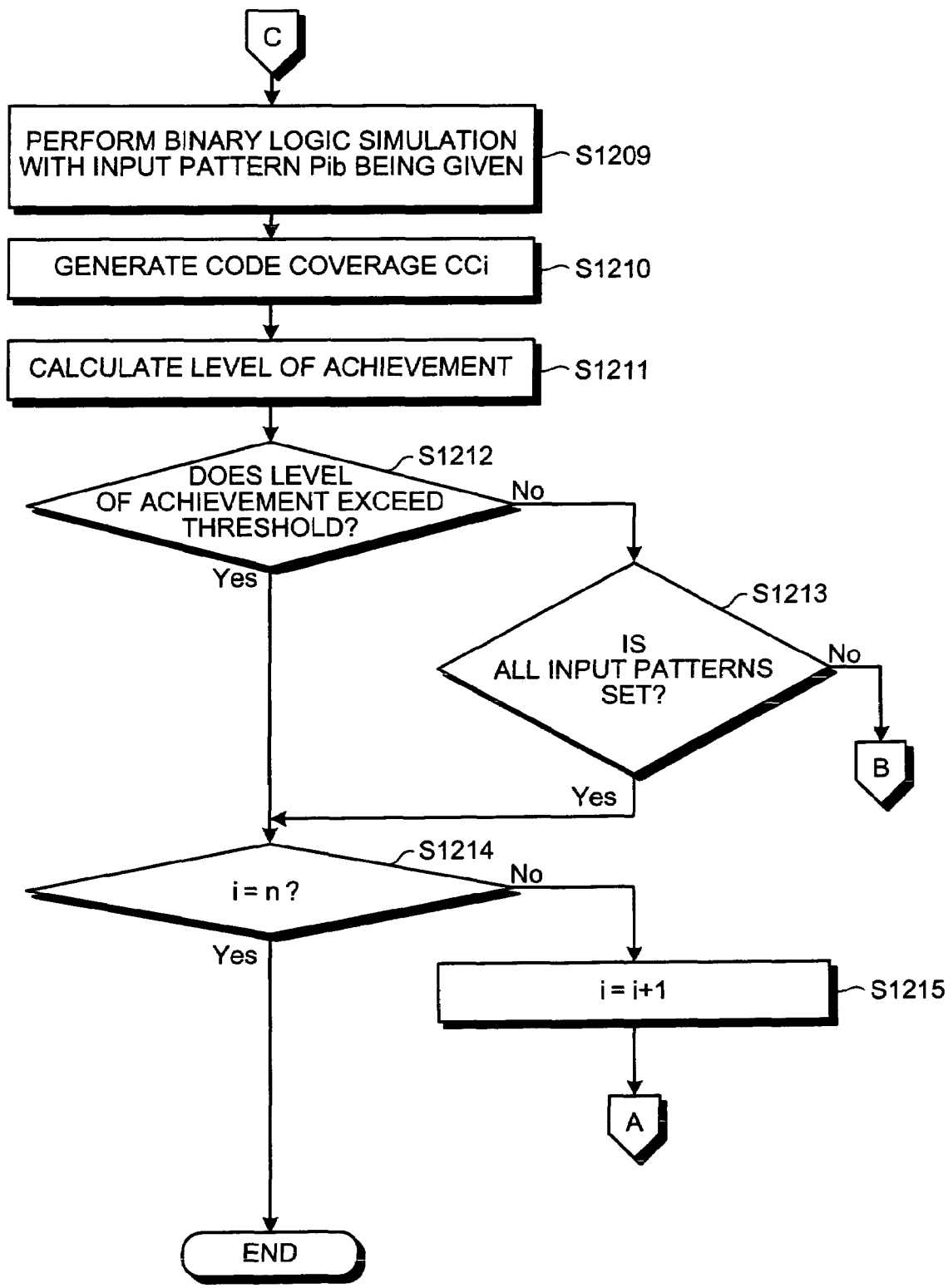

FIGS. 12A and 12B are a flowchart of a verification supporting process to be performed by the verification supporting apparatus according to the first embodiment. In FIG. 12A, when the circuit information 300 is input ("YES" at step S1201), "i" is set as i=1 (step S1202). Then, when a verification scenario Si is input ("YES" at step S1203), an input pattern PXi is set (step S1204). The input pattern PXi is an input pattern PVi of which the variable value is substituted by the undefined value x in the verification scenario Si.

A logic simulation of three values (0, 1, x) is executed by giving the input pattern PXi to the circuit information 300 (step S1205) Then, code-coverage upper-limit information CMi is determined (step S1206). Thereafter, the variable values of the input pattern PVi in the verification scenario Si are substituted by an arbitrary logic value, thereby setting an input pattern Pi (Pia, Pib) (step S1207). Then, a logic simulation of two values (0, 1) is executed by giving an input pattern Pia to the circuit information 300 (step S1208).

As shown in FIG. 12B, a logic simulation of the two values (0, 1) is executed by giving an input pattern Pib to the circuit information 300 (step S1209). Then, from the execution results obtained at steps S1208 and S1209, code coverage CCi is generated (step S1210). Then, a level of achievement of the code coverage CCi with respect to the code-coverage upper-limit information CMi is calculated (step S1211).

When the level of achievement exceeds a threshold ("YES" at step S1212), the procedure proceeds to step S1214. When the level of achievement does not exceed the threshold ("NO" at step S1212), the code coverage CCi does not cover all input patterns that indicates the functions in the verification scenario Si. When all input patterns have not yet been set ("NO" at step S1213), the procedure returns to step S1207 to reset the input pattern Pi. On the other hand, when all input patterns have been set ("YES" at step S1213), the procedure proceeds to step S1214.

At step S1214, when i=n where n represents the number of verification scenarios ("YES" at step S1214), a series of processes is finished. On the other hand, when "i" is not n ("NO" at step S1214), "i" is incremented (step S1215), and then the process returns to step S1203. Thus, verification coverage can be evaluated for a next verification scenario Si.

According to the first embodiment, the user can evaluate the verification coverage using the level of achievement of the code coverage CC1 with respect to the code-coverage upper-limit information CM1. When the level of achievement exceeds the threshold, the code coverage CC1 covers all input patterns indicative of the functions of the verification scenario S1. Therefore, by applying the code coverage CC1, omission of verification can be prevented, and timing of ending the logic simulation can be appropriately determined.

When the level of achievement does not exceed the threshold, this means that the code coverage CC1 does not cover all input patterns in the verification scenario S1. Therefore, by referring to a signal line having a value that is different between the code-coverage upper-limit information CM and the code coverage CC, a design failure in the verification target circuit can be efficiently detected. Furthermore, from the number of detected design failures, timing of ending the logic simulation can be appropriately determined.

Furthermore, when the level of achievement does not exceed the threshold, an input pattern to be given to the logic simulator 502 is reset, and then a logic simulation is executed by the logic simulator 502. Then, a logic simulation is automatically performed until the level of achievement exceeds the threshold, thereby appropriately determining timing of ending the logic simulation.

While in the first embodiment, the circuit information 300 using a net list is used, in a second embodiment, the RTL description is used as the circuit information. Thus, the input circuit information is not limited to the circuit information 300 represented by the net list, thereby improving versatility and achieving an efficient verification support. A mechanism of the verification supporting process in the second embodiment is approximately same as that in the first embodiment.

FIG. 13 is a schematic of circuit information according to the second embodiment. The circuit information is represented by an RTL description 1300 shown in FIG. 13. The RTL description 1300 indicates a synchronous sequential circuit in synchronization with a rising of an input signal clk.

Figure 14:
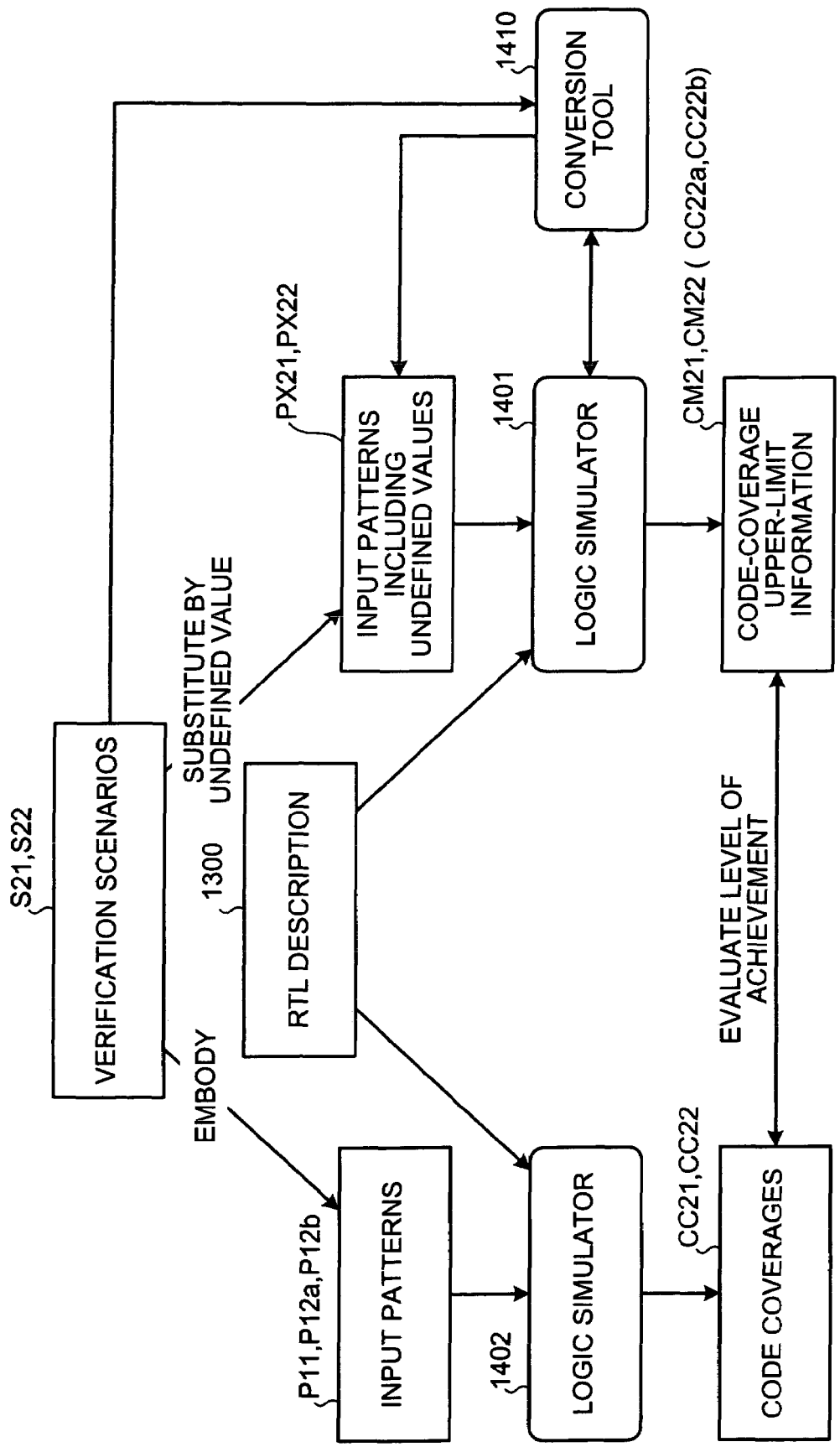
FIG. 14 is a schematic of a structure of a verification supporting apparatus according to the second embodiment.

FIG. 14 is a schematic of a structure of the verification supporting apparatus according to the second embodiment. A verification scenario is used to verify a function of the verification target circuit indicated by the RTL description 1300. For example, the verification scenarios are as follows.

Verification Scenario S21:

"(op, data)=(2'b00, p1) is given in a first cycle (hereinafter, "cycle 1"), and (op, data)=(2'b01, p2) is then given in a next cycle (hereinafter, "cycle 2")".

Verification Scenario S22:

"(op, data)=(2'b00, p1) is given in the cycle 1, (op, data)= (2'b10, p2) is then given in the cycle 2, and then (op, data)= (2'b11, p3) is given in a next cycle (hereinafter, "cycle 3")".

In the above verification scenarios S21 and S22, p1 to p3 are variable values. Arbitrary eight bits are assigned, thereby setting input patterns. In the cycles 1 and 2, the undefined value x is assigned to the variable values p1 and p2, thereby setting an input pattern PX21 of the verification scenario S21 as follows.

Input Pattern PX21 cycle 1: (op, data)=(2'b00, p1)=(2'b00, 8'bxxxxxxxx)

cycle 2: (op, data)=(2'b01, p2)=(2'b01, 8'bxxxxxxxx)

Then, a logic simulator 1401 gives the input pattern PX21 to the RTL description 1300, and executes a logic simulation. The logic simulator 1401 corresponds to the first executing unit 211. An execution result RX21 of the logic simulation includes lines [013] and [015] executable in the verification scenario S21 among lines [013], [015], [018], [021], and [025]. Each of the lines includes an execution statement. The execution result RX21 for the verification scenario S21 represents code-coverage upper-limit information CM21 ([013], [015]) for the verification scenario S21.

Similarly, for the verification scenario S22, the undefined value x is assigned to the variable values p1 to p3 with respect to cycles 1 to 3, thereby setting an input pattern PX22 for the verification scenario S22 as follows.

Input Pattern PX22 cycle 1: (op, data)=(2'b00, p1)=(2'b00, 8'bxxxxxxxx)

cycle 2: (op, data)=(2'b10, p2)=(2'b10, 8'bxxxxxxxx)

cycle 3: (op, data)=(2'b11, p3)=(2'b11, 8'bxxxxxxxx)

Then, the logic simulator 1401 gives the input pattern PX22 to the RTL description 1300 and executes a logic simulation. An execution result RX22 of the logic simulation includes lines executable in the verification scenario S22 among lines [013], [015], [018], [021], and [025]. Each of the lines includes an execution statement. The execution result RX22 ([013], [018], [021], [025]) for the verification scenario S22 represents code-coverage upper-limit information CM22 ([013], [018], [021], [025]) for the verification scenario S22.

A logic simulator 1402 executes a logic simulation by giving a specific input pattern P11 for the verification scenario S21 to the RTL description 1300. The logic simulator 1402 corresponds to the second executing unit 212 described previously. Here, an example of the input pattern P11 is shown.

Input Pattern P11 cycle 1: (op, data)=(2'b00, p1)=(2'b00, 8'b10101010)

cycle 2: (op, data)=(2'b01, p2)=(2'b01, 8'b11001100)

With the input pattern P11 being given to the RTL description 1300, the line [013] is executed in the cycle 1, and then the line [015] is executed in the cycle 2. A set of lines thus covered, that is, code coverage CC21 for the verification scenario S21, is as follows.

CC21=([013], [015])

When this code coverage CC21 and the code-coverage upper-limit information CM21 are compared with each other, the lines of the code-coverage upper-limit information CM21 all coincide with those of the code coverage CC21. Therefore, the level of achievement of the code coverage CC21 is 2/2, that is, 100%.

By giving an input pattern P12 for the verification scenario S22 to the RTL description 1300, the logic simulator 1402 executes a logic simulation. Examples of an input pattern P12a is shown.

Input Pattern P12a cycle 1: (op, data)=(2'b00, p1)=(2'b00, 8'b11110000)

cycle 2: (op, data)=(2'b10, p2)=(2'b10, 8'b11111111)

cycle 3: (op, data)=(2'b11, p3)=(2'b11, 8'b01010101)

By giving the input pattern P12a to the RTL description 1300, the line [013] is executed in the cycle 1, and then the line [021] is executed in the cycle 2. On the other hand, in the cycle 3, no line is executed. A set of covered lines, that is, code coverage CC22a for the verification scenario S22, is as follows.

CC22a=([013], [021])

When the code coverage CC22a and the code-coverage upper-limit information CM22 are compared with each other, the code-coverage upper-limit information CM22 represents ([013], [018], [021], [025]), and therefore, execution statements [013] and [021] are covered in the code-coverage upper-limit information CM22. Therefore, the level of achievement of the code coverage CC22a is 2/4, that is, 50%.

Since the level of achievement is not 100%, another input pattern has to be added for the verification scenario S22. An example of another input pattern P12b for the verification scenario S22 is as follows.

Input Pattern P12b cycle 1: (op, data)=(2'b00, p1)=(2'b00, 8'b00110011)

cycle 2: (op, data)=(2'b10, p2)=(2'b10, 8'b00000000)

cycle 3: (op, data)=(2'b11, p3)=(2'b11, 8'b00001111)

With this input pattern P12b being given to the RTL description 1300, the line [013] is executed in the cycle 1, the line [018] is executed in the cycle 2, and then the line [025] is executed in the cycle 3. A set of covered lines, that is, code coverage CC22b for the verification scenario S22 is as follows.

CC22b=([013], [018], [025])

Therefore, by combining the code coverage CC22b and the code coverage CC22a with the input pattern P12a, a set of covered lines, that is, the code coverage CC22 is as follows.

CC22=([013], [018], [021], [025])

When the code coverage C22 and the code-coverage upper-limit information CM22 are compared with each other, all lines of the code-coverage upper-limit information CM22 coincide with those of the code coverage CC22. Therefore, the level of achievement of the code coverage CC22 is 2/2, that is, 100%.

A conversion tool 1410 causes the logic simulator 1401 to perform a special operation. Specifically, when a result obtained by evaluating a conditional expression with a conditional branch statement, such as "if" or "case", is the undefined value x, it is recorded on the RTL description 1300 that all branch destination candidates have been executed, and then substitutes the undefined value x for all variables that are influenced by the execution of the branch destinations. For example, in the following statement, if the value of A is x, (it is recorded such that the entire statement has been executed, and then) an operation of substituting x for both B and C is executed.

if($A$==1)$B$<=1;

else$C$<=1;

More strictly, x is substituted for B only if A is x and B is not 1, and x is substituted for C only if A is x and C is not 1. The conversion tool 1410 corresponds to the converting unit 209 described above.

Figure 15A:
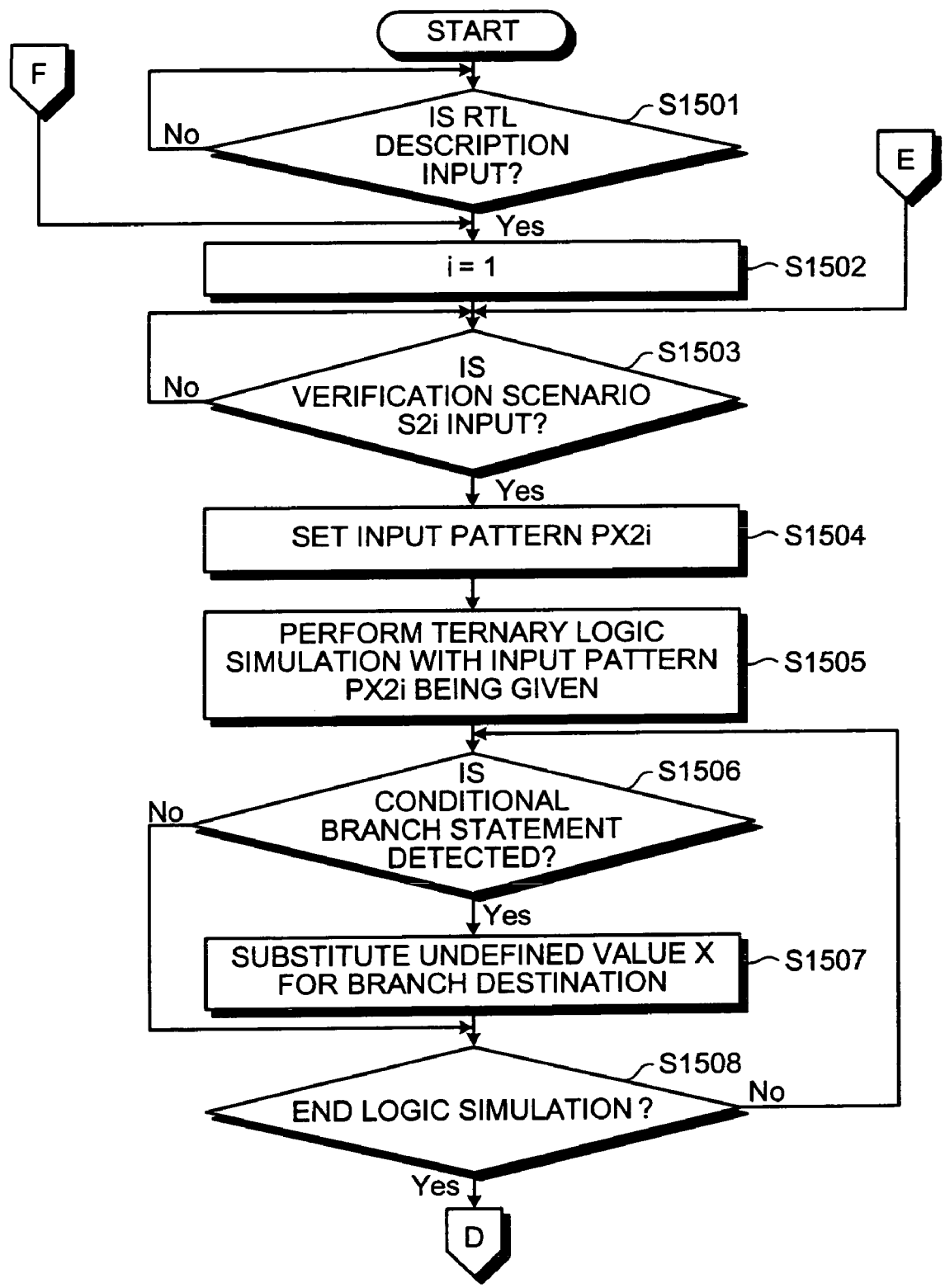
FIGS. 15A and 15B are a flowchart of a verification supporting process according to the second embodiment.
Figure 15B:
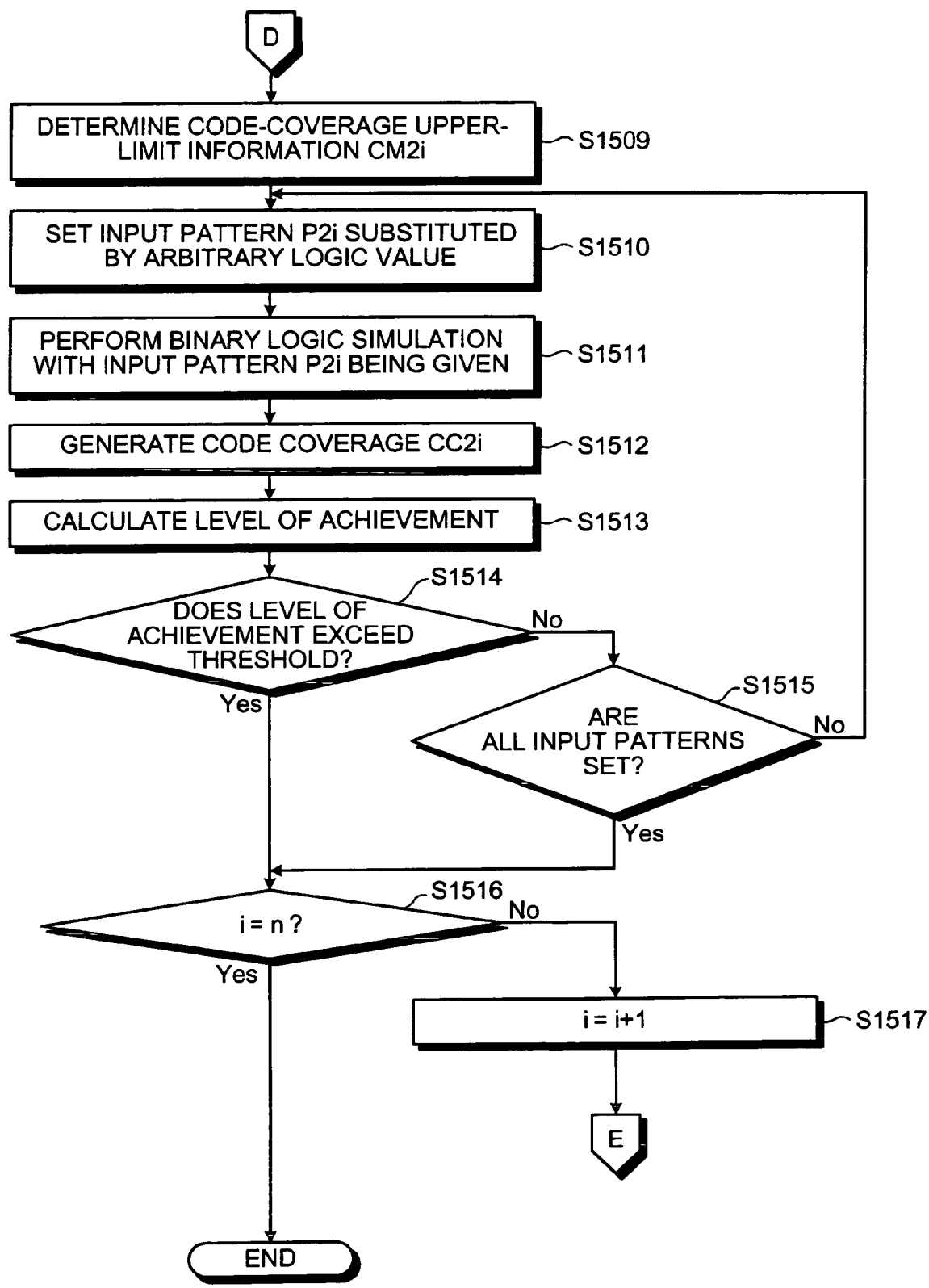

FIGS. 15A and 15B are a flowchart of a verification supporting process to be performed by the verification supporting apparatus according to the second embodiment. As shown in FIG. 15A, when the RTL description 1300 is input ("YES" at step S1501), "i" is set as i=1 (step S1502). When a verification scenario S2$i$ is input ("YES" at step S1503), the variable values (in the verification scenario S21, corresponding to p1 and p2) in the verification scenario S2$i$ are substituted by the undefined value x, thereby setting an input pattern PX2$i$ (step S1504).

Next, a logic simulation of three values (0, 1, x) is executed by giving the input pattern PX2$i$ to the RTL description 1300 (step S1505). When a conditional branch statement is not detected in the RTL description 1300 ("NO" at step S1506), the process proceeds to step S1508. On the other hand, when a conditional branch statement is detected in the RTL description 1300 ("YES" at step S1506), the undefined value x is substituted for the branch destination (step S1507), and then the process proceeds to step S1508.

Then, when the logic simulation has not ended ("NO" at step S1508), the procedure returns to step S1506. On the other hand, when the logic simulation has ended ("YES" at step S1508), code-coverage upper-limit information CM2$i$ is determined as shown in FIG. 15B (step S1509). Thereafter, an input pattern P2$i$ with the variable value in the verification scenario S2$i$ being substituted by an arbitrary logic value is set (step S1510).

Then, a logic simulation of the two values (0, 1) is executed by giving an input pattern P2$i$ to the RTL description 1300 (step S1511). hen, from the execution result, code coverage CC2$i$ is generated (step S1512).

Then, a level of achievement of the code coverage CC2$i$ with respect to the code-coverage upper-limit information CM2$i$ is calculated (step S1513). When the level of achievement exceeds a threshold ("YES" at step S1514), the process proceeds to step S1516. When the level of achievement does not exceed the threshold ("NO" at step S1514), the code coverage CC2$i$ does not cover all input patterns that indicate the functions in the verification scenario S2$i$. When all input patterns have not yet been set ("NO" at step S1515), the procedure returns to step S1510 to reset the input pattern P2$i$. On the other hand, when all input patterns have been set ("YES" at step S1515), the process proceeds to step S1516.

At step S1516, when i=n where "n" represents the number of verification scenarios ("YES" at step S1516), a series of processes is finished. On the other hand, when "i" is not n ("NO" at step S1516), "I" is incremented (step S1517), and then the process returns to step S1503. Thus, verification coverage can be evaluated for a next verification scenario S2$i$.

According to the second embodiment, the user can evaluate the verification coverage using the level of achievement of the code coverage CC2$i$ with respect to the code-coverage upper-limit information CM2$i$. When the level of achievement exceeds the threshold, the code coverage CC2$i$ covers all input patterns. Therefore, by applying the code coverage CC2$i$, omission of verification can be prevented, and timing of ending the logic simulation can be appropriately determined.

When the level of achievement does not exceed the threshold, this means that the code coverage CC2$i$ does not cover all input patterns. Therefore, by referring to a signal line having a value that is different between the code-coverage upper-limit information CM2$i$ and the code coverage CC2$i$, a design failure in the verification target circuit can be efficiently detected. Furthermore, from the number of detected design failures, timing of ending the logic simulation can be appropriately determined.

Furthermore, when the level of achievement does not exceed the threshold, an input pattern to be given to the logic simulator 1402 is reset, and then, a logic simulation is executed by the logic simulator 1402. The logic simulation is automatically performed until the level of achievement exceeds the threshold, thereby appropriately determining timing of ending the logic simulation.

Moreover, the RTL description 1300 can be used as the circuit information. This makes it possible to improve versatility in selecting circuit information. Thus, it is possible to efficiently evaluate the verification coverage. In addition, even when the circuit information is represented by an RTL description, the code-coverage upper-limit information can be accurately determined.

Furthermore, if the logic simulator 1401 can only select an operation according to the Verilog-HDL grammar rules, that is, an operation in which the "if" condition is not satisfied and the "else" statement is executed, the conversion tool 1410 may rewrite the RTL description 1300 in advance. An RTL description rewritten is shown in FIG. 16. FIG. 16 is a schematic for explaining the RTL description rewritten.

When a newly added line is executed at the time of a logic simulation in an RTL description 1600 shown in FIG. 16, one or more lines corresponding to the added line are assumed to be executed. In an actual verification operation with "0" or "1" being assigned to a variable portion, a normal simulator operation (the original RTL description 1300) can be used. Then, for the verification scenario S21, verification coverage is decided by determining whether the lines [013] and [015] have been executed. For the verification scenario S22, verification coverage is decided by determining whether the lines [013], [018], [021], and [025] have been executed.

Figure 17:
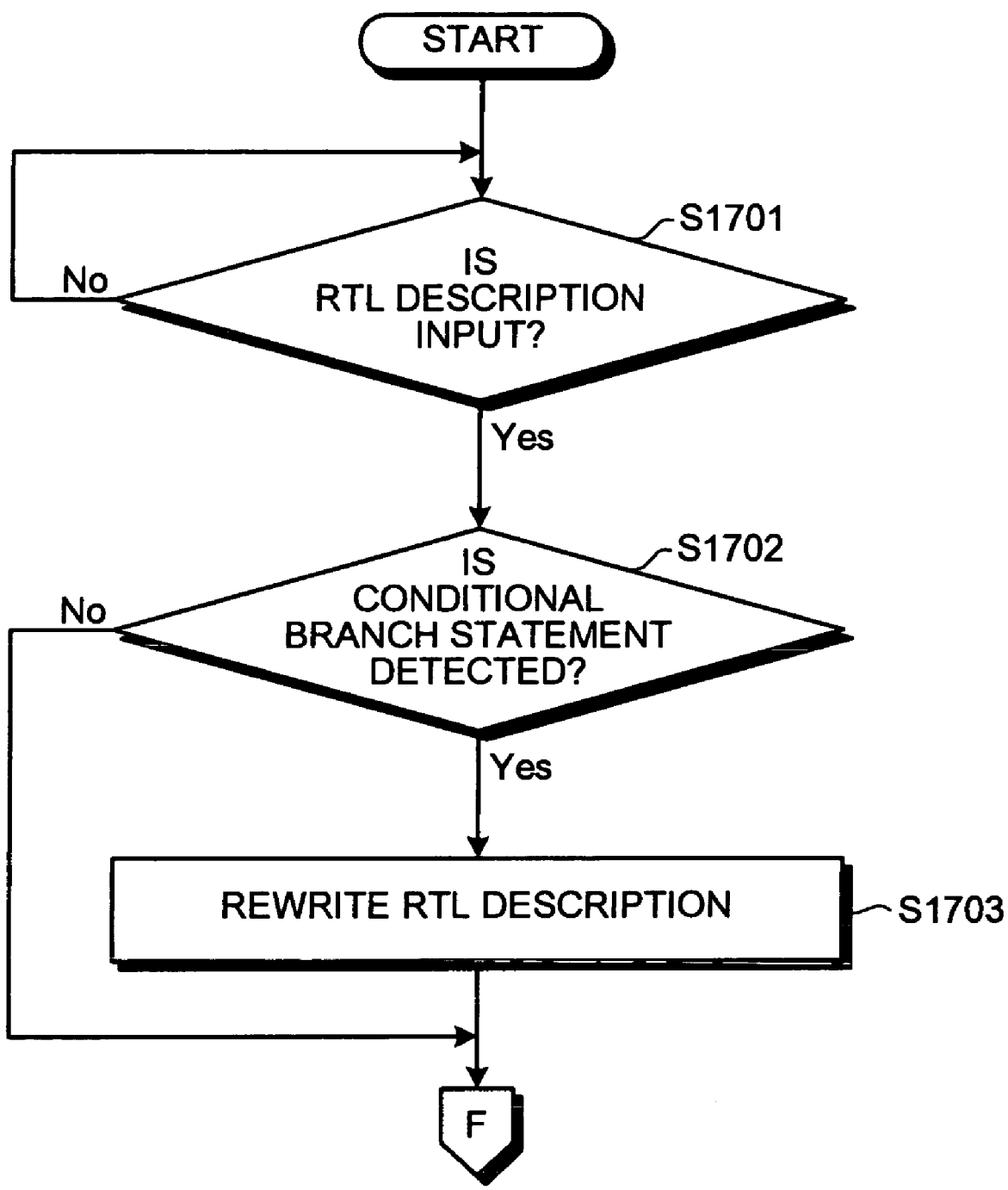
FIG. 17 is a flowchart of another verification supporting process according to the second embodiment.

FIG. 17 is a flowchart of another verification supporting process to be performed by the verification supporting apparatus according to the second embodiment. As shown in FIG. 17, when the RTL description 1300 is input ("YES" at step S1701) and a conditional branch statement is detected in the RTL description 1300 ("YES" at step S1702), the RTL description 1300 is rewritten by the conversion tool 1410 (step S1703). Thus, the RTL description 1600 is generated.

On the other hand, when a conditional branch statement is not detected at step S1702 ("NO" at step S1702) or after the RTL description 1300 has been rewritten, the process proceeds to step S1502 shown in FIG. 15A.

When a conditional branch statement is present in the RTL description 1300, the RTL description 1300 is converted (rewritten) so that any branch destination of the conditional branch statement can be executed, and by using the RTL description 1600 obtained through conversion, a logic simulation is executed. Thus, the RTL description 1300 can be converted in advance before a logic simulation so as to comply with the evaluation of verification coverage. Thus, a logic simulation can be efficiently performed, and the accuracy of the code-coverage upper-limit information can be improved.

Figure 18:
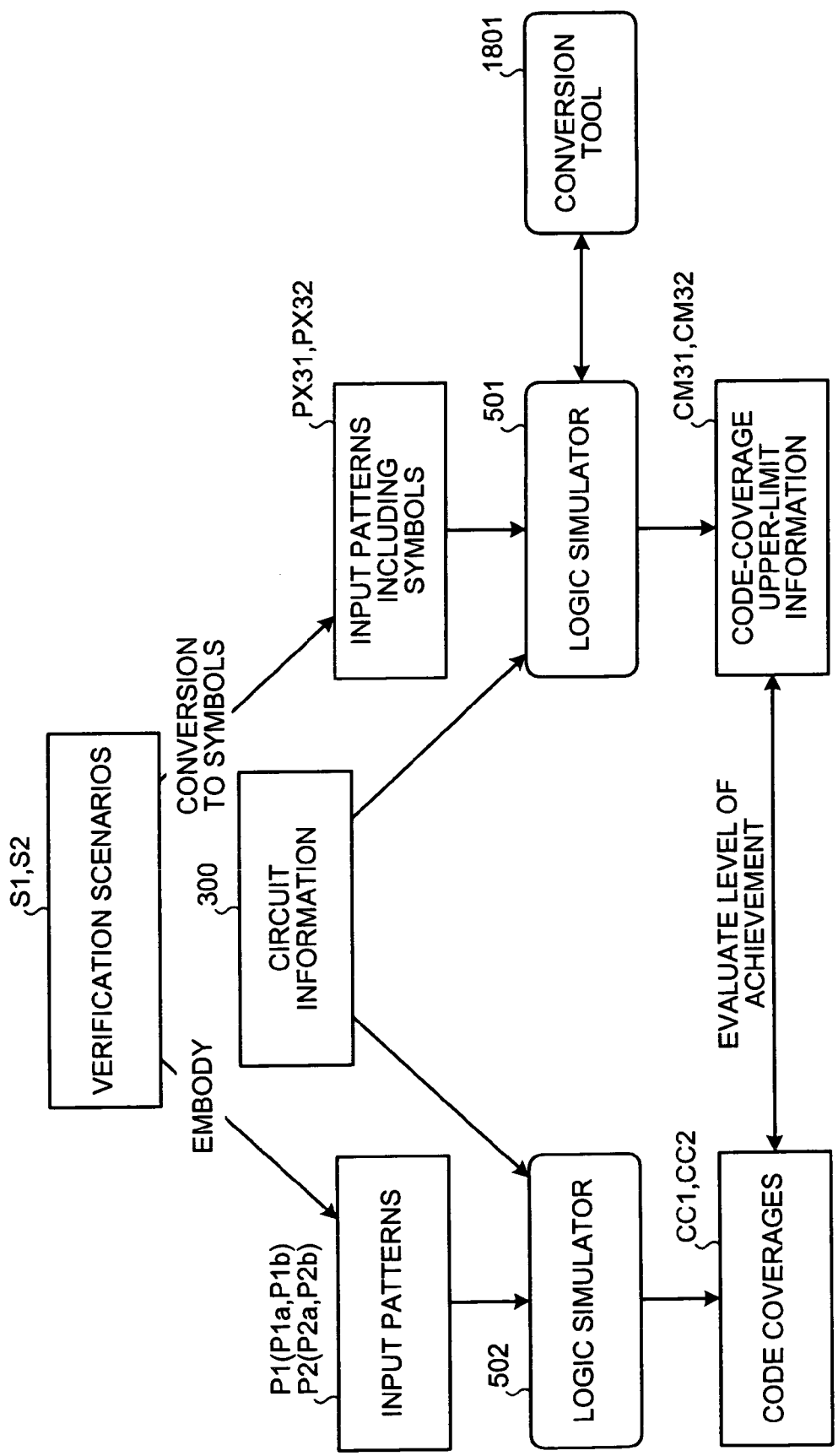
FIG. 18 is a schematic of a structure of a verification supporting apparatus according to a third embodiment of the present invention.

FIG. 18 is a schematic of a structure of a verification supporting apparatus according to a third embodiment. Components identical to those shown in FIG. 5 are provided with the same reference numerals, and are not described herein.

While in the first embodiment, the undefined value x is substituted for the variable values (b, c, d, e) of the verification scenario S1 (S2), thereby setting the input pattern PX1 (PX2), in the third embodiment, symbols (p, q, r, s) are substituted for the variable values (b, c, d, e), thereby setting input patterns PX31 and PX32. Then, in a logic simulation, a symbol simulation using the symbols (p, q, r, s) of the input patterns PX31 and PX32 is executed. Thus, logic operation using a symbol for each signal propagation can be performed, thereby obtaining accurate propagation information.

In the third embodiment, the verification scenarios S1 and S2, the input patterns P1 and P2, and the code coverages CC1 and CC2 used in the first embodiment are also used for description. However, description of these components is similar to that in the first embodiment, and is therefore omitted in the third embodiment. In the third embodiment, the input pattern PX31 for the verification scenario S1 is as follows.

$$PX31=(0, p, q, r, s)$$

Figure 19:
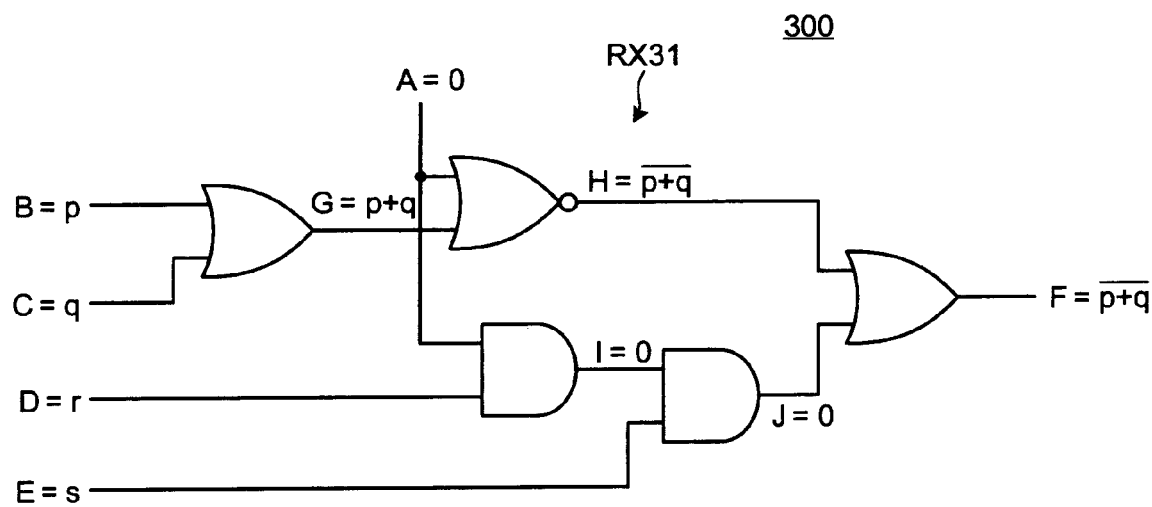
FIG. 19 is a schematic for explaining an execution result RX31 of a symbol simulation when an input pattern PX31 is provided.

Specifically, for the verification scenario S1, by giving the input pattern PX31 to the circuit information 300 shown in FIG. 3, a symbol simulation is executed by the logic simulator 501. The execution result is shown in FIG. 19. FIG. 19 is a schematic for explaining the execution result of the symbol simulation when the input pattern PX31 is given. In FIG. 19, an execution result RX31 is as follows.

$$RX31=(A, B, C, D, E, F, G, H, I, J)$$

$$(0, p, q, r, s, \overline{p+q}, p+q, \overline{p+q}, 0, 0) \quad (1)$$

From the execution result RX31 shown in this equation 1, it is found that the symbols (p, q, r, s) have been propagated to the signal lines B, C, D, E, F, G, and H. Therefore, code-coverage upper-limit information CM31 is as follows.

$$CM31=(B, C, D, E, F, G, H)$$

$$(p, q, r, s, \overline{p+q}, p+q, \overline{p+q}) \quad (2)$$

In the verification scenario S1, it is estimated that signal value variations regarding seven signal lines B, C, D, E, F, G, and H are achievable. In a similar manner, for the verification scenario S2, an input pattern PX32 is set as follows.

$$PX32=(A, B, C, D, E)=(1, p, q, r, s)$$

Figure 20:
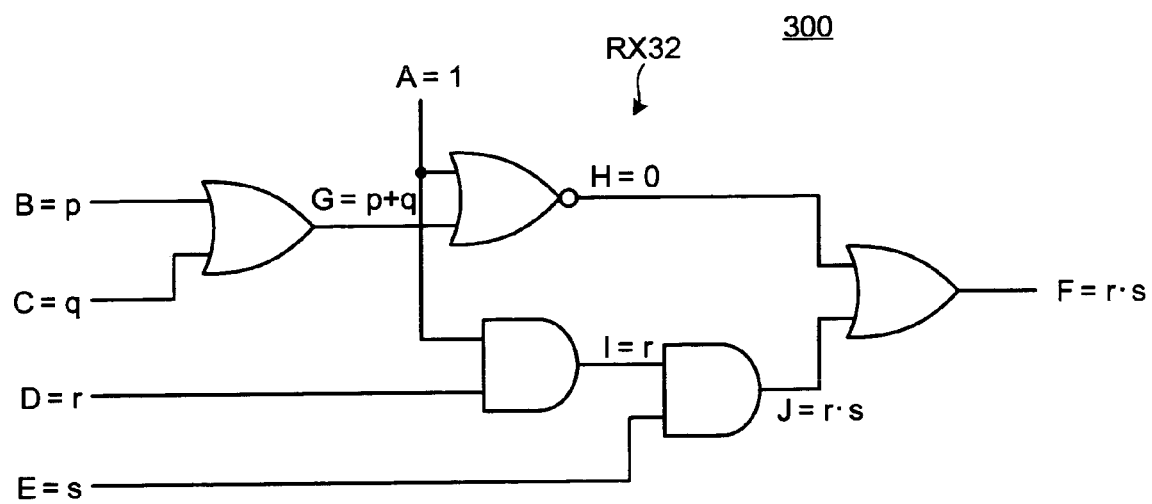
FIG. 20 is a schematic for explaining an execution result RX32 of the symbol simulation when an input pattern PX32 is provided.

Then, by giving the input pattern PX32 to the circuit information 300, a symbol simulation is executed by the logic simulator 501. An execution result RX32 of this symbol simulation is shown in FIG. 20. FIG. 20 is a schematic of the execution result RX32 of the symbol simulation with the input pattern PX32 being given. The execution result RX32 shown in FIG. 20 is as follows.

$$RX32=(A, B, C, D, E, F, G, H, I, J)$$

$$(1, p, q, r, s, r \cdot s, p+q, 0, r, r \cdot s) \quad (3)$$

From the execution result RX32 shown in equation 3, it is found that the symbols (p, q, r, s) have been propagated to the signal lines B, C, D, E, F, G, I, and J. Therefore, code-coverage upper-limit information CM32 is as follows.

$$CM32=(B, C, D, E, F, G, I, J)$$

$$(p, q, r, s, r \cdot s, p+q, r, r \cdot s) \quad (4)$$

In the verification scenario S2, it is estimated that variations in signal values regarding these signal lines B, C, D, E, F, G, I, and J are achievable.

These pieces of code-coverage upper-limit information CM31 and CM32 obtained through symbol simulations can represent signal variations by symbols, as shown in equations 2 and 4. More accurate information than the pieces of code-coverage upper-limit information CM1 and CM2 using the undefined value x in the first embodiment can be obtained, thereby improving the verification coverage.

Moreover, as shown in FIG. 18, when the logic equation formed of a plurality of symbols propagated to the signal lines includes symbols more than a predetermined number of symbols during the execution of the logic simulator 501, a conversion tool 1801 converts the logic equation so that the logic equation includes other symbols. The logic simulator 501 executes a symbol simulation using the converted symbols.

When the verification target circuit is a large-scale circuit, a logic equation may be formed of an enormous number of symbols. Therefore, the amount of calculation increases, and the processing time also increases. Conversion by the conversion tool 1801 to a single symbol is performed so as to prevent an increase in the amount of calculation and to simplify the arithmetic operation, thereby reducing the processing time.

Figure 21A:
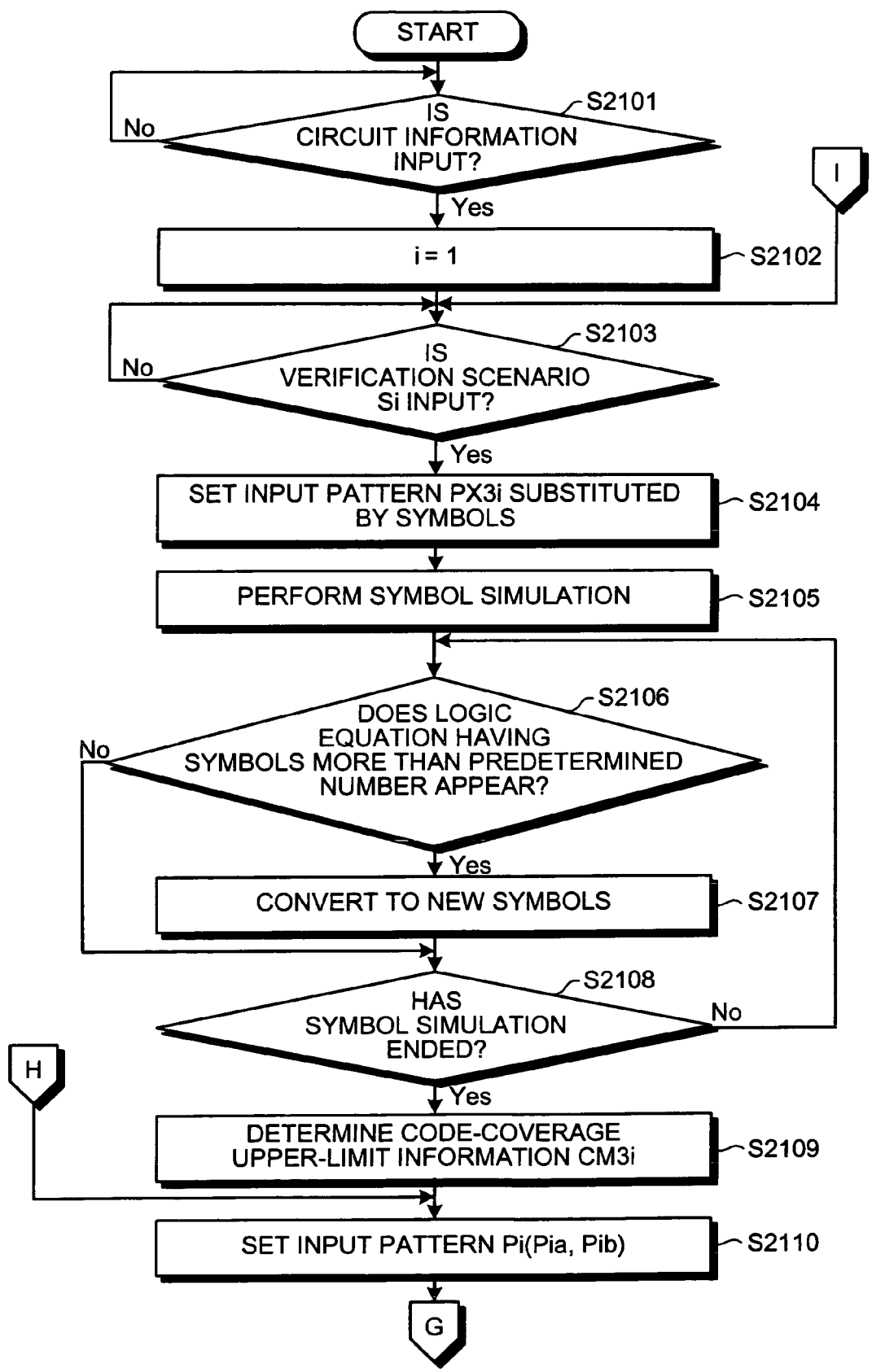
FIGS. 21A and 21B are a flowchart of a verification supporting process according to the third example.
Figure 21B:
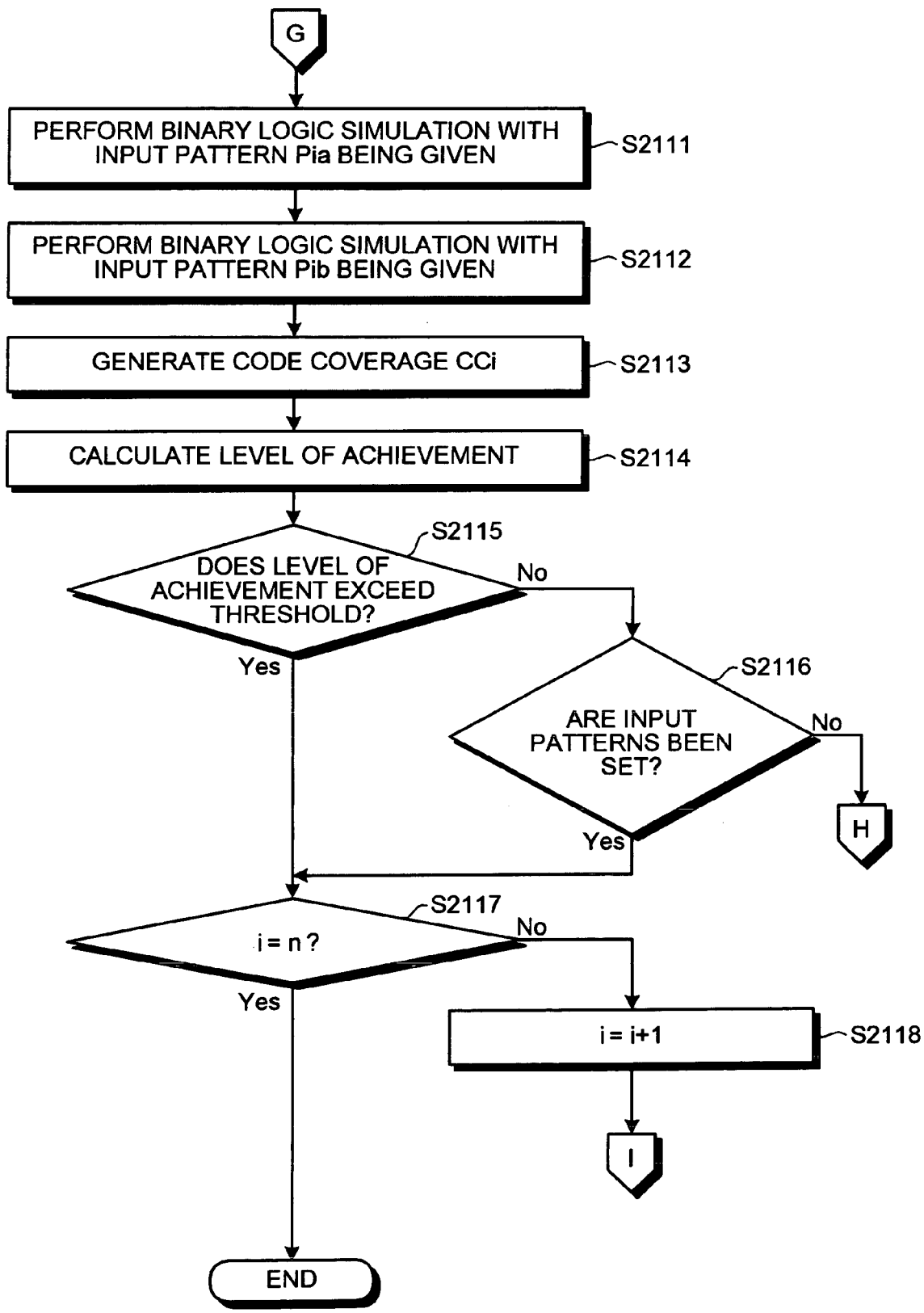
Figure 22:
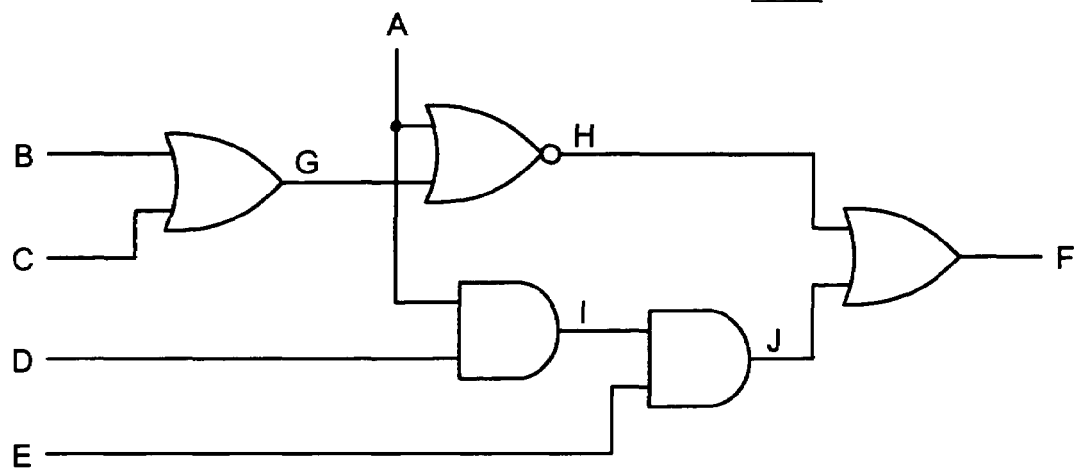
FIG. 22 is a circuit diagram of a logic circuit.
Figure 23:
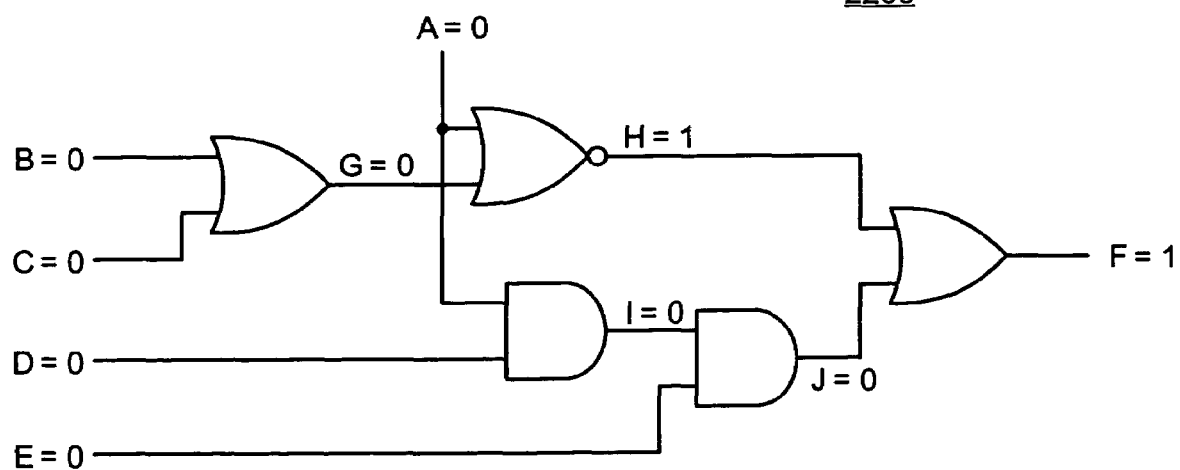
FIG. 23 is a schematic for explaining a simulation result of the logic circuit.
Figure 24:
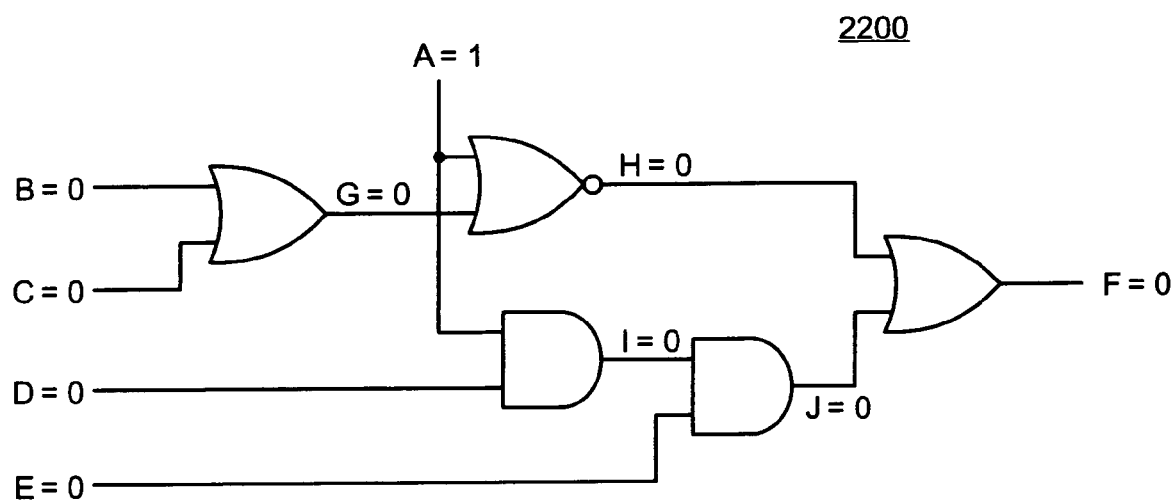
FIG. 24 is a schematic for explaining another simulation result of the logic circuit.
Figure 25:
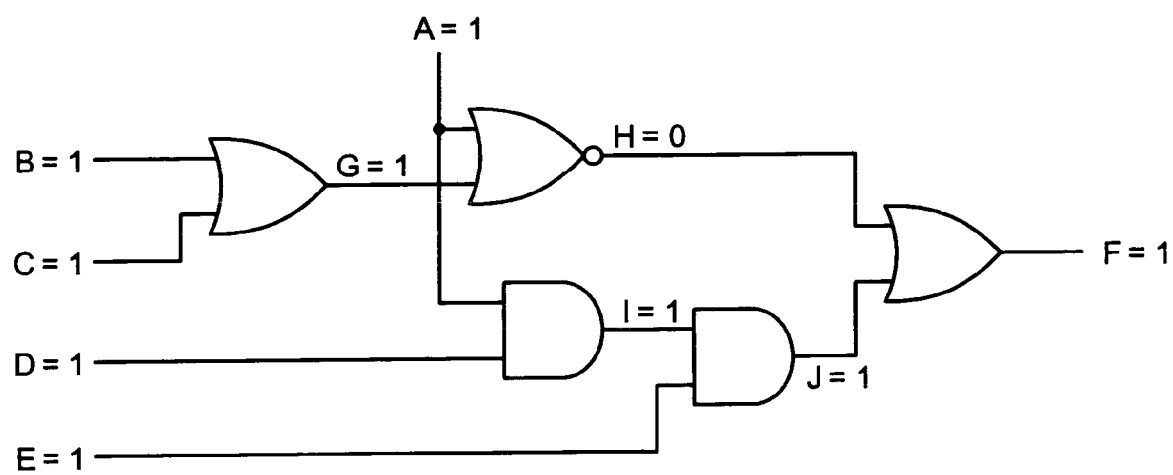
FIG. 25 is a schematic for explaining still another simulation result of the logic circuit.

FIGS. 21A and 21B are a flowchart of a verification supporting process according to the third embodiment. In FIG. 21A, when the circuit information 300 is input ("YES" at step S2101), "i" is set as i=1 (step S2102). Next, when a verification scenario Si is input ("YES" at step S2103), an input pattern PX3i obtained by substituting symbols for the variable values of an input pattern PVi in the verification scenario Si is set (step S2104).

Next, a logic simulation of three values (0, 1, x) is executed by giving the input pattern PX3i to the circuit information 300 (step S2105). When a logic equation having symbols more than a predetermined number of symbols has not appeared during the symbol simulation ("NO" at step S2106), the procedure proceeds to step S2108.

On the other hand, when a logic equation having symbols more than a predetermined number of symbols has appeared during the symbol simulation ("YES" at step S2106), the logic equation is converted by the conversion tool 1801 to new symbols (step S2107). Then, at step S2108, if the symbol simulation has not yet ended ("NO" at step S2108), the procedure returns to step S2106.

When the logic simulation has ended ("YES" at step S2108), code-coverage upper-limit information CM3i is determined (step S2109). Thereafter, the variable values of the input pattern PVi in the verification scenario Si are substituted by an arbitrary logic value, thereby setting an input pattern Pi (Pia, Pib) (step S2110).

Then, as shown in FIG. 21B, a logic simulation of two values (0, 1) is executed with an input pattern Pia given to the circuit information 300 (step S2111). Also, a logic simulation of the two values (0, 1) is executed with an input pattern Pib given to the circuit information 300 (step S2112). Then, from the execution results obtained at steps S2111 and S2112, code coverage CCi is generated (step S2113).

Then, a level of achievement of the code coverage CCi with respect to the code-coverage upper-limit information CM3i is calculated (step S2114). When the level of achievement exceeds a threshold ("YES" at step S2115), the process proceeds to step S2117. On the other hand, when the level of achievement does not exceed the threshold ("NO" at step S2115), this means that the code coverage CCi does not cover all input patterns that indicates the functions in the verification scenario Si. When all input patterns have not yet been set ("NO" at step S2116), the procedure returns to step S2110 to reset the input pattern Pi. On the other hand, when all input patterns have been set ("YES" at step S2116), the process proceeds to step S2117.

At step S2117, when i=n where "n" represents the number of verification scenarios ("YES" at step S2117), a series of processes is finished. On the other hand, when "i" is not n ("NO" at step S2117), "i" is incremented (step S2118), and then the process return to step S2103. Thus, the verification coverage can be evaluated for a next verification scenario Si.

According to the third embodiment, an effect similar to that in the first example described above can be achieved. Particularly, in a symbol simulation, a logic equation using symbols is used to represent a propagation portion, thereby more accurately representing the code-coverage upper-limit information. This improves accuracy in coverage of the code coverage assumed to be achievable when all input patterns included in the verification scenario Si are executed. Also, by applying the conversion tool 1801, an increase in the amount of calculation during the symbol simulation can be prevented, and the arithmetic operation can be simplified, thereby reducing the processing time.

As described, according to the verification support program, the computer-readable recording medium that stores the verification supporting program, the verification supporting apparatus, and the verification supporting method according to the first to third embodiments of the present invention, it is possible to quantitatively evaluate whether a level of achievement of code coverage estimated for each verification scenario is sufficiently high. This enables use of the code-coverage upper-limit information for each scenario for judgment of the verification coverage as the conventional functional coverage and the code coverage.

Particularly, the code coverage for each verification scenario indicates how many combination patterns of functions and codes have been tested. Therefore, it is possible to attain verification with less omission than a case in which the functional coverage and the code coverage are individually achieved.

Thus, according to the verification support program, the recording medium having recorded thereon the verification supporting program, the verification supporting apparatus, and the verification supporting method according to embodiments of the present invention, by estimating a level of achievement of a code coverage, the verification coverage regarding the function of the verification scenario can be improved. Moreover, a design failure of the LSI can be accurately and efficiently detected. In addition, timing of ending the logic simulation can be accurately determined.

The verification supporting method described in the first to third embodiments can be realized by a computer, such as a personal computer or a work station, executing a program prepared in advance. The program is recorded on a computer-readable recording medium, such as a HD, a FD, a CD-ROM, MO, and DVD. The program is executed by the computer reading from the recording medium. This program may be a transfer medium that is distributed via a network, such as the Internet.

According to the present invention, it is possible to improve verification coverage in verification regarding functions of a verification scenario, thereby achieving accurate and effective detection of a design failure of an LSI.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable recording medium that stores therein a computer program for supporting verification, the computer program making a computer execute:

obtaining circuit information and a verification scenario, the circuit information of a verification target circuit, the verification scenario including a variable value for verifying the verification target circuit;

executing a logic simulation by giving the verification scenario to the circuit information;

determining, based on a result of the logic simulation, code-coverage upper-limit information that indicates a portion to which the variable value is propagated in the circuit information; and substituting an undefined value for the variable value in the verification scenario, wherein the executing includes executing the logic simulation by giving the verification scenario, which includes the variable value for which the undefined value is substituted, to the circuit information, and the determining includes determining code-coverage upper-limit information that indicates a portion to which the undefined value is propagated in the circuit information.

2. The computer-readable recording medium according to claim 1, wherein the obtaining includes obtaining a register-transfer-level description of the verification target circuit as the circuit information, the executing includes executing the logic simulation by giving the verification scenario to the register-transfer-level description, and the determining includes determining code-coverage upper-limit information that indicates a portion to which the undefined value is propagated in the register-transfer-level description.

3. The computer-readable recording medium according to claim 2, wherein the computer program further makes the computer execute converting, when a conditional branch statement that is included in the register-transfer-level description is not satisfied in the logic simulation, an execution result of another conditional branch statement, to which the conditional branch statement is branched, to the undefined value, and the executing includes continuously executing the logic simulation using the undefined value to which the execution result is converted.

4. The computer-readable recording medium according to claim 2, wherein the computer program further makes the computer execute converting, when the register-transfer-level description includes a conditional branch statement, the register-transfer-level description such that any branch destination of the conditional branch statement is executed, and the executing includes executing the logic simulation by giving the verification scenario to the register-transfer-level description converted.

5. A computer-readable recording medium that stores therein a computer program for supporting verification, the computer program making a computer execute:

obtaining circuit information and a verification scenario, the circuit information of a verification target circuit, the verification scenario including a variable value for verifying the verification target circuit;

executing a logic simulation by giving the verification scenario to the circuit information;

determining, based on a result of the logic simulation, code-coverage upper-limit information that indicates a portion to which the variable value is propagated in the circuit information; and substituting a symbol for the variable value of the verification scenario, wherein the executing includes executing the logic simulation by giving the verification scenario, which includes the symbol substituted, to the circuit information.

6. The computer-readable recording medium according to claim 5, wherein the computer program further makes the computer execute converting, when a logic equation that is formed of a predetermined number of symbols appears in the logic simulation, the logic equation to a number of symbols, the number being smaller than the predetermined number, the executing includes continuously executing the logic simulation using the symbols to which the logic equation is converted, and the determining includes determining code-coverage upper-limit information that indicates a portion to which the symbols used are propagated in the circuit information.

7. The computer-readable recording medium according to claim 1, wherein the computer program further makes the computer execute:

setting a first input pattern by giving a first logic value to the variable value;

executing a first logic simulation by giving the first input pattern to the circuit information;

generating a first code coverage regarding the circuit information based on a result of the first logic simulation; and calculating a level of achievement of the first code coverage with respect to the code-coverage upper-limit information.

8. The computer-readable recording medium according to claim 7, wherein the computer program further makes the computer execute judging, based on the level of achievement, verification coverage that is achieved by the first code coverage.

9. The computer-readable recording medium according to claim 8, wherein the setting includes setting a second input pattern that is different from the first input pattern by giving a second logic value that is different from the first logic value to the variable value based on a judging result that is obtained at the judging, the executing the first logic simulation includes executing a second logic simulation by giving the second input pattern to the circuit information;

the generating includes generating a second code coverage that is different from the first code coverage based on the result of the first logic simulation and a result of the second logic simulation, and the calculating includes calculating a level of achievement of the second code coverage with respect to the code-coverage upper-limit information.

10. A method for supporting verification comprising:

obtaining circuit information and a verification scenario, the circuit information of a verification target circuit, the verification scenario including a variable value for verifying the verification target circuit;

executing a logic simulation by giving the verification scenario to the circuit information;

determining, based on a result of the logic simulation, code-coverage upper-limit information that indicates a portion to which the variable value is propagated in the circuit information; and substituting an undefined value for the variable value in the verification scenario, wherein the executing includes executing the logic simulation by giving the verification scenario, which includes the variable value for which the undefined value is substituted, to the circuit information, and the determining includes determining code-coverage upper-limit information that indicates a portion to which the undefined value is propagated in the circuit information.

* * * * *

UNITED STATES PATENT AND TRADEMARK OFFICE
CERTIFICATE OF CORRECTION

PATENT NO. : 7,464,015 B2
APPLICATION NO. : 11/116283
DATED : December 9, 2008
INVENTOR(S) : Hiroaki Iwashita Page 1 of 1

It is certified that error appears in the above-identified patent and that said Letters Patent is hereby corrected as shown below:

Title Page, Item [74] Column 2 (Attorney, Agent, or Firm), Line 1, change "Helsey" to --Halsey--.

Signed and Sealed this

Seventeenth Day of March, 2009

JOHN DOLL
*Acting Director of the United States Patent and Trademark Office*